(12) United States Patent
Hernandez-Ariguznaga

(10) Patent No.: US 9,038,832 B2
(45) Date of Patent: May 26, 2015

(54) ADAPTER PANEL SUPPORT ASSEMBLY

(71) Applicant: Selene Elizabeth Hernandez-Ariguznaga, Reynosa (MX)

(72) Inventor: Selene Elizabeth Hernandez-Ariguznaga, Reynosa (MX)

(73) Assignee: Corning Cable Systems LLC, Hickory, NC (US)

( * ) Notice: Subject to any disclaimer, the term of this patent is extended or adjusted under 35 U.S.C. 154(b) by 0 days.

(21) Appl. No.: 13/688,675

(22) Filed: Nov. 29, 2012

(65) Prior Publication Data
US 2013/0134115 A1    May 30, 2013

Related U.S. Application Data

(60) Provisional application No. 61/565,015, filed on Nov. 30, 2011.

(51) Int. Cl.
*H05K 7/16* (2006.01)
*H05K 7/18* (2006.01)

(52) U.S. Cl.
CPC . *H05K 7/186* (2013.01); *H05K 7/16* (2013.01)

(58) Field of Classification Search
USPC ......... 211/26, 85.3, 99, 144, 150, 164, 169.1, 211/171; 248/121, 122.1, 149, 276.1, 248/284.1, 291.1, 371, 372.1, 397; 385/134, 135; 403/90, 92, 93, 94, 96; 74/527

See application file for complete search history.

(56) References Cited

U.S. PATENT DOCUMENTS

| | | | |
|---|---|---|---|
| 620,013 A | 2/1899 | Barnes | |
| 2,528,910 A | 11/1950 | Poe | |
| 2,614,685 A | 10/1952 | Miller | |
| 3,081,717 A | 3/1963 | Yurevich | |
| 3,175,873 A | 3/1965 | Blomquist et al. | |
| 3,212,192 A | 10/1965 | Bachmann et al. | |
| 3,433,886 A | 3/1969 | Myers | |
| 3,494,306 A * | 2/1970 | Aguilar | 108/6 |

(Continued)

FOREIGN PATENT DOCUMENTS

| | | |
|---|---|---|
| AU | 2010270959 A1 | 2/2012 |
| CA | 2029592 A1 | 5/1992 |

(Continued)

OTHER PUBLICATIONS

Annex to Form PCT/ISA/2006, Communication Relating to the Results of the Partial International Search, for PCT/US2009/004549 mailed Feb. 10, 2010, 2 pages.

(Continued)

*Primary Examiner* — Joshua Rodden

(57) ABSTRACT

An adapter panel support assembly having a frame assembly, a mounting bracket, and a connection assembly is disclosed. The frame assembly may receive and support an adapter panel. The connection assembly connects the frame assembly to the mounting bracket to allow the frame assembly to rotate and releasably lock at more than two positions when force is applied to the frame assembly. The connection assembly has a plurality of detents such that the frame assembly releasably locks at predetermined positions of the detents. The connection assembly has a ball bearing plunger mounted in the frame assembly. The ball bearing plunger retracts when the force is applied to the frame assembly to rotate the frame assembly between the detents and extends into each of the detents at the position of each of the detents to releasably lock the frame assembly at the position of that detent.

16 Claims, 5 Drawing Sheets

(56) References Cited

U.S. PATENT DOCUMENTS

| | | | |
|---|---|---|---|
| 3,545,712 A | 12/1970 | Ellis | |
| 3,568,263 A | 3/1971 | Meehan | |
| 3,646,244 A | 2/1972 | Cole | |
| 3,664,514 A * | 5/1972 | Drake | 211/169 |
| 3,683,238 A * | 8/1972 | Olds et al. | 361/786 |
| 3,701,835 A | 10/1972 | Eisele et al. | |
| 3,880,396 A | 4/1975 | Freiberger et al. | |
| 3,906,592 A | 9/1975 | Sakasegawa et al. | |
| 3,991,960 A | 11/1976 | Tanaka | |
| 4,047,797 A | 9/1977 | Arnold et al. | |
| 4,059,872 A | 11/1977 | Delesandri | |
| 4,119,285 A | 10/1978 | Bisping et al. | |
| 4,148,454 A | 4/1979 | Carlson et al. | |
| 4,239,316 A | 12/1980 | Spaulding | |
| 4,244,638 A | 1/1981 | Little et al. | |
| 4,285,486 A | 8/1981 | Von Osten et al. | |
| 4,303,296 A | 12/1981 | Spaulding | |
| 4,354,731 A | 10/1982 | Mouissie | |
| 4,457,482 A | 7/1984 | Kitagawa | |
| 4,525,012 A | 6/1985 | Dunner | |
| 4,540,222 A | 9/1985 | Burrell | |
| 4,561,615 A | 12/1985 | Medlin, Jr. | |
| 4,564,163 A | 1/1986 | Barnett | |
| 4,597,173 A | 7/1986 | Chino et al. | |
| 4,611,875 A | 9/1986 | Clarke et al. | |
| 4,635,886 A | 1/1987 | Santucci et al. | |
| 4,645,292 A | 2/1987 | Sammueller | |
| 4,657,340 A | 4/1987 | Tanaka et al. | |
| 4,681,288 A | 7/1987 | Nakamura | |
| 4,702,551 A | 10/1987 | Coulombe | |
| 4,711,518 A | 12/1987 | Shank et al. | |
| 4,736,100 A | 4/1988 | Vastagh | |
| 4,744,629 A | 5/1988 | Bertoglio et al. | |
| 4,747,020 A | 5/1988 | Brickley et al. | |
| 4,752,110 A | 6/1988 | Blanchet et al. | |
| 4,753,510 A | 6/1988 | Sezerman | |
| 4,787,706 A | 11/1988 | Cannon, Jr. et al. | |
| 4,792,203 A | 12/1988 | Nelson et al. | |
| 4,798,432 A | 1/1989 | Becker et al. | |
| 4,805,979 A | 2/1989 | Bossard et al. | |
| 4,808,774 A | 2/1989 | Crane | |
| 4,824,193 A | 4/1989 | Maeda et al. | |
| 4,824,196 A | 4/1989 | Bylander | |
| 4,826,277 A | 5/1989 | Weber et al. | |
| 4,838,643 A | 6/1989 | Hodges et al. | |
| 4,840,449 A | 6/1989 | Ghandeharizadeh | |
| 4,865,280 A | 9/1989 | Wollar | |
| 4,898,448 A | 2/1990 | Cooper | |
| 4,900,123 A | 2/1990 | Barlow | |
| 4,911,662 A | 3/1990 | Debortoli et al. | |
| 4,948,220 A | 8/1990 | Violo et al. | |
| 4,949,376 A | 8/1990 | Nieves et al. | |
| 4,971,421 A | 11/1990 | Ori | |
| 4,986,625 A | 1/1991 | Yamada et al. | |
| 4,988,831 A | 1/1991 | Wilson et al. | |
| 4,991,928 A | 2/1991 | Zimmer | |
| 4,995,688 A | 2/1991 | Anton et al. | |
| 5,001,602 A | 3/1991 | Suffi et al. | |
| 5,005,941 A | 4/1991 | Barlow et al. | |
| 5,017,211 A | 5/1991 | Wenger et al. | |
| 5,023,646 A | 6/1991 | Ishida et al. | |
| 5,024,498 A | 6/1991 | Becker et al. | |
| 5,028,114 A | 7/1991 | Krausse et al. | |
| 5,037,175 A | 8/1991 | Weber | |
| 5,048,918 A | 9/1991 | Daems et al. | |
| 5,060,897 A | 10/1991 | Thalenfeld | |
| 5,066,149 A | 11/1991 | Wheeler et al. | |
| 5,067,784 A | 11/1991 | Debortoli et al. | |
| 5,071,211 A | 12/1991 | Debortoli et al. | |
| 5,071,220 A | 12/1991 | Ruello et al. | |
| 5,073,042 A | 12/1991 | Mulholland et al. | |
| 5,074,635 A | 12/1991 | Justice et al. | |
| 5,076,688 A | 12/1991 | Bowen et al. | |
| 5,080,459 A | 1/1992 | Wettengel et al. | |
| 5,100,221 A | 3/1992 | Carney et al. | |
| 5,104,336 A | 4/1992 | Hatanaka et al. | |
| 5,125,060 A | 6/1992 | Edmundson | |
| 5,127,082 A | 6/1992 | Below et al. | |
| 5,127,851 A | 7/1992 | Hilbert et al. | |
| 5,129,030 A | 7/1992 | Petrunia | |
| 5,129,607 A | 7/1992 | Satoh | |
| 5,133,039 A | 7/1992 | Dixit | |
| 5,138,678 A | 8/1992 | Briggs et al. | |
| 5,138,688 A | 8/1992 | Debortoli | |
| 5,142,598 A | 8/1992 | Tabone | |
| 5,142,607 A | 8/1992 | Petrotta et al. | |
| 5,150,277 A | 9/1992 | Bainbridge et al. | |
| D330,368 S | 10/1992 | Bourgeois et al. | |
| 5,152,760 A | 10/1992 | Latina | |
| 5,153,910 A | 10/1992 | Mickelson et al. | |
| 5,157,749 A | 10/1992 | Briggs et al. | |
| 5,167,001 A | 11/1992 | Debortoli et al. | |
| 5,170,452 A | 12/1992 | Ott | |
| 5,189,723 A | 2/1993 | Johnson et al. | |
| 5,199,099 A | 3/1993 | Dalgoutte | |
| 5,204,929 A | 4/1993 | Machall et al. | |
| 5,209,572 A | 5/1993 | Jordan | |
| 5,214,735 A | 5/1993 | Henneberger et al. | |
| 5,224,186 A | 6/1993 | Kishimoto et al. | |
| 5,230,492 A | 7/1993 | Zwart et al. | |
| 5,231,687 A | 7/1993 | Handley | |
| 5,231,688 A | 7/1993 | Zimmer | |
| 5,233,674 A | 8/1993 | Vladic | |
| 5,239,609 A | 8/1993 | Auteri | |
| 5,243,679 A | 9/1993 | Sharrow et al. | |
| 5,253,320 A | 10/1993 | Takahashi et al. | |
| 5,260,957 A | 11/1993 | Hakimi et al. | |
| 5,261,633 A | 11/1993 | Mastro | |
| 5,265,187 A | 11/1993 | Morin et al. | |
| 5,274,729 A | 12/1993 | King et al. | |
| 5,274,731 A | 12/1993 | White | |
| 5,278,933 A | 1/1994 | Hunsinger et al. | |
| 5,280,138 A | 1/1994 | Preston et al. | |
| 5,285,515 A | 2/1994 | Milanowski et al. | |
| 5,291,570 A | 3/1994 | Filgas et al. | |
| 5,315,679 A | 5/1994 | Baldwin et al. | |
| 5,317,663 A | 5/1994 | Beard et al. | |
| 5,323,478 A | 6/1994 | Milanowski et al. | |
| 5,323,480 A | 6/1994 | Mullaney et al. | |
| 5,329,520 A | 7/1994 | Richardson | |
| 5,333,193 A | 7/1994 | Cote et al. | |
| 5,333,221 A | 7/1994 | Briggs et al. | |
| 5,333,222 A | 7/1994 | Belenkiy et al. | |
| 5,337,400 A | 8/1994 | Morin et al. | |
| 5,339,379 A | 8/1994 | Kutsch et al. | |
| 5,347,603 A | 9/1994 | Belenkiy et al. | |
| 5,353,367 A | 10/1994 | Czosnowski et al. | |
| 5,359,688 A | 10/1994 | Underwood | |
| 5,363,466 A | 11/1994 | Milanowski et al. | |
| 5,363,467 A | 11/1994 | Keith | |
| 5,366,388 A | 11/1994 | Freeman et al. | |
| 5,367,598 A | 11/1994 | Devenish, III et al. | |
| 5,373,421 A | 12/1994 | Detsikas et al. | |
| 5,383,051 A | 1/1995 | Delrosso et al. | |
| 5,390,272 A | 2/1995 | Repta et al. | |
| 5,398,295 A | 3/1995 | Chang et al. | |
| 5,398,820 A | 3/1995 | Kiss | |
| 5,399,814 A | 3/1995 | Staber et al. | |
| 5,401,193 A | 3/1995 | Lo Cicero et al. | |
| 5,402,515 A | 3/1995 | Vidacovich et al. | |
| 5,408,557 A | 4/1995 | Hsu | |
| RE34,955 E | 5/1995 | Anton et al. | |
| 5,412,751 A | 5/1995 | Siemon et al. | |
| 5,416,837 A | 5/1995 | Cote et al. | |
| 5,418,874 A | 5/1995 | Carlisle et al. | |
| 5,420,956 A | 5/1995 | Grugel et al. | |
| 5,420,958 A | 5/1995 | Henson et al. | |
| 5,421,532 A | 6/1995 | Richter | |
| 5,438,641 A | 8/1995 | Malacarne | |
| 5,442,725 A | 8/1995 | Peng | |
| 5,442,726 A | 8/1995 | Howard et al. | |
| 5,443,232 A | 8/1995 | Kesinger et al. | |
| 5,444,804 A | 8/1995 | Yui et al. | |
| 5,448,015 A | 9/1995 | Jamet et al. | |

(56) References Cited

U.S. PATENT DOCUMENTS

| | | |
|---|---|---|
| 5,450,518 A | 9/1995 | Burek et al. |
| 5,458,019 A | 10/1995 | Trevino |
| 5,471,555 A | 11/1995 | Braga et al. |
| 5,479,505 A | 12/1995 | Butler et al. |
| 5,481,634 A | 1/1996 | Anderson et al. |
| 5,481,939 A | 1/1996 | Bernardini |
| 5,490,229 A | 2/1996 | Ghandeharizadeh et al. |
| 5,495,549 A | 2/1996 | Schneider et al. |
| 5,497,416 A | 3/1996 | Butler, III et al. |
| 5,497,444 A | 3/1996 | Wheeler |
| 5,511,144 A | 4/1996 | Hawkins et al. |
| 5,511,798 A | 4/1996 | Kawamoto et al. |
| 5,519,804 A | 5/1996 | Burek et al. |
| 5,530,786 A | 6/1996 | Radliff et al. |
| 5,535,970 A | 7/1996 | Gobbi |
| 5,538,213 A | 7/1996 | Brown |
| 5,542,015 A | 7/1996 | Hultermans |
| 5,546,495 A | 8/1996 | Bruckner et al. |
| 5,548,641 A | 8/1996 | Butler et al. |
| 5,553,183 A | 9/1996 | Bechamps |
| 5,553,186 A | 9/1996 | Allen |
| 5,563,971 A | 10/1996 | Abendschein |
| 5,572,617 A | 11/1996 | Bernhardt et al. |
| 5,575,680 A | 11/1996 | Suffi |
| 5,577,151 A | 11/1996 | Hoffer |
| 5,590,234 A | 12/1996 | Pulido |
| 5,595,507 A | 1/1997 | Braun et al. |
| 5,596,670 A | 1/1997 | Debortoli et al. |
| 5,600,020 A | 2/1997 | Wehle et al. |
| 5,602,954 A | 2/1997 | Nolf et al. |
| 5,608,606 A | 3/1997 | Blaney |
| 5,613,030 A | 3/1997 | Hoffer et al. |
| 5,617,501 A | 4/1997 | Miller et al. |
| 5,638,474 A | 6/1997 | Lampert et al. |
| 5,640,476 A | 6/1997 | Womack et al. |
| 5,640,482 A | 6/1997 | Barry et al. |
| 5,647,043 A | 7/1997 | Anderson et al. |
| 5,647,045 A | 7/1997 | Robinson et al. |
| 5,650,334 A | 7/1997 | Zuk et al. |
| 5,668,910 A | 9/1997 | Arnett |
| 5,668,911 A | 9/1997 | Debortoli |
| 5,671,273 A | 9/1997 | Lanquist |
| 5,689,605 A | 11/1997 | Cobb et al. |
| 5,689,607 A | 11/1997 | Vincent et al. |
| 5,692,079 A | 11/1997 | Iso |
| 5,694,511 A | 12/1997 | Pimpinella et al. |
| 5,701,380 A | 12/1997 | Larson et al. |
| 5,704,573 A | 1/1998 | de Beers et al. |
| 5,708,742 A | 1/1998 | Beun et al. |
| 5,708,751 A | 1/1998 | Mattei |
| 5,710,851 A | 1/1998 | Walter et al. |
| 5,717,810 A | 2/1998 | Wheeler |
| 5,734,776 A | 3/1998 | Puetz |
| 5,740,300 A | 4/1998 | Hodge |
| 5,742,982 A | 4/1998 | Dodd et al. |
| 5,751,874 A | 5/1998 | Chudoba et al. |
| 5,751,882 A | 5/1998 | Daems et al. |
| 5,754,724 A | 5/1998 | Peterson et al. |
| 5,758,003 A | 5/1998 | Wheeler et al. |
| 5,758,004 A | 5/1998 | Alarcon et al. |
| 5,761,026 A | 6/1998 | Robinson et al. |
| 5,765,698 A * | 6/1998 | Bullivant ........................ 211/26 |
| 5,769,908 A | 6/1998 | Koppelman |
| 5,774,612 A | 6/1998 | Belenkiy et al. |
| 5,778,122 A | 7/1998 | Giebel et al. |
| 5,778,130 A | 7/1998 | Walters et al. |
| 5,781,686 A | 7/1998 | Robinson et al. |
| 5,788,087 A * | 8/1998 | Orlando ........................ 211/26 |
| 5,790,741 A | 8/1998 | Vincent et al. |
| 5,793,920 A | 8/1998 | Wilkins et al. |
| 5,793,921 A | 8/1998 | Wilkins et al. |
| 5,796,908 A | 8/1998 | Vicory |
| 5,806,687 A * | 9/1998 | Ballesteros et al. ............ 211/26 |
| 5,823,646 A | 10/1998 | Arizpe et al. |
| 5,825,955 A | 10/1998 | Ernst et al. |
| 5,825,961 A | 10/1998 | Wilkins et al. |
| 5,828,807 A | 10/1998 | Tucker et al. |
| 5,832,162 A | 11/1998 | Sarbell |
| 5,835,657 A | 11/1998 | Suarez et al. |
| 5,835,658 A | 11/1998 | Smith |
| 5,862,290 A | 1/1999 | Burek et al. |
| 5,870,519 A | 2/1999 | Jenkins et al. |
| 5,874,733 A | 2/1999 | Silver et al. |
| 5,877,565 A | 3/1999 | Hollenbach et al. |
| 5,880,864 A | 3/1999 | Williams et al. |
| 5,881,200 A | 3/1999 | Burt |
| 5,883,995 A | 3/1999 | Lu |
| 5,884,003 A | 3/1999 | Cloud et al. |
| 5,887,095 A | 3/1999 | Nagase et al. |
| 5,887,106 A | 3/1999 | Cheeseman et al. |
| 5,892,877 A | 4/1999 | Meyerhoefer |
| 5,894,540 A | 4/1999 | Drewing |
| 5,901,220 A | 5/1999 | Garver et al. |
| 5,903,693 A | 5/1999 | Brown |
| 5,906,342 A | 5/1999 | Kraus |
| 5,909,298 A | 6/1999 | Shimada et al. |
| 5,913,006 A | 6/1999 | Summach |
| 5,914,976 A | 6/1999 | Jayaraman et al. |
| 5,915,055 A | 6/1999 | Bennett et al. |
| 5,923,804 A | 7/1999 | Rosson |
| 5,930,425 A | 7/1999 | Abel et al. |
| 5,933,557 A | 8/1999 | Ott |
| 5,940,563 A | 8/1999 | Kobayashi et al. |
| 5,943,460 A | 8/1999 | Mead et al. |
| 5,945,633 A | 8/1999 | Ott et al. |
| 5,946,440 A | 8/1999 | Puetz |
| 5,949,946 A | 9/1999 | Debortoli et al. |
| 5,953,962 A | 9/1999 | Hewson |
| 5,956,439 A | 9/1999 | Pimpinella |
| 5,956,444 A | 9/1999 | Duda et al. |
| 5,956,449 A | 9/1999 | Otani et al. |
| 5,966,492 A | 10/1999 | Bechamps et al. |
| 5,969,294 A | 10/1999 | Eberle et al. |
| 5,975,769 A | 11/1999 | Larson et al. |
| 5,978,540 A | 11/1999 | Bechamps et al. |
| 5,980,303 A | 11/1999 | Lee et al. |
| 5,987,203 A | 11/1999 | Abel et al. |
| 5,993,071 A | 11/1999 | Hultermans |
| 5,995,700 A | 11/1999 | Burek et al. |
| 5,999,393 A | 12/1999 | Brower |
| 6,001,831 A | 12/1999 | Papenfuhs et al. |
| 6,009,224 A | 12/1999 | Allen |
| 6,009,225 A | 12/1999 | Ray et al. |
| 6,011,831 A | 1/2000 | Nieves et al. |
| 6,027,252 A | 2/2000 | Erdman et al. |
| 6,027,352 A | 2/2000 | Byrne |
| 6,041,042 A | 3/2000 | Bussiere |
| 6,044,193 A | 3/2000 | Szentesi et al. |
| 6,049,963 A | 4/2000 | Boe |
| 6,058,235 A | 5/2000 | Hiramatsu et al. |
| 6,061,492 A | 5/2000 | Strause et al. |
| 6,078,661 A | 6/2000 | Arnett et al. |
| 6,079,881 A | 6/2000 | Roth |
| 6,088,497 A | 7/2000 | Phillips et al. |
| 6,118,075 A | 9/2000 | Baker et al. |
| 6,127,627 A | 10/2000 | Daoud |
| 6,130,983 A | 10/2000 | Cheng |
| 6,134,370 A | 10/2000 | Childers et al. |
| 6,141,222 A | 10/2000 | Toor et al. |
| 6,149,313 A | 11/2000 | Giebel et al. |
| 6,149,315 A | 11/2000 | Stephenson |
| 6,151,432 A | 11/2000 | Nakajima et al. |
| 6,160,946 A | 12/2000 | Thompson et al. |
| 6,170,784 B1 | 1/2001 | MacDonald et al. |
| 6,172,782 B1 | 1/2001 | Kobayashi |
| 6,175,079 B1 | 1/2001 | Johnston et al. |
| 6,181,861 B1 | 1/2001 | Wenski et al. |
| 6,188,687 B1 | 2/2001 | Mussman et al. |
| 6,188,825 B1 | 2/2001 | Bandy et al. |
| 6,192,180 B1 | 2/2001 | Kim et al. |
| 6,200,170 B1 | 3/2001 | Amberg et al. |
| 6,201,919 B1 | 3/2001 | Puetz et al. |
| 6,201,920 B1 | 3/2001 | Noble et al. |
| 6,208,796 B1 | 3/2001 | Williams Vigliaturo |

(56) References Cited

U.S. PATENT DOCUMENTS

| | | |
|---|---|---|
| 6,212,324 B1 | 4/2001 | Lin et al. |
| 6,215,938 B1 | 4/2001 | Reitmeier et al. |
| 6,216,987 B1 | 4/2001 | Fukuo |
| 6,227,717 B1 | 5/2001 | Ott et al. |
| 6,229,948 B1 | 5/2001 | Blee et al. |
| 6,234,683 B1 | 5/2001 | Waldron et al. |
| 6,234,685 B1 | 5/2001 | Carlisle et al. |
| 6,236,795 B1 | 5/2001 | Rodgers |
| 6,240,229 B1 | 5/2001 | Roth |
| 6,243,522 B1 | 6/2001 | Allan et al. |
| 6,245,998 B1 | 6/2001 | Curry et al. |
| 6,247,851 B1 | 6/2001 | Ichihara |
| 6,250,816 B1 | 6/2001 | Johnson et al. |
| 6,259,850 B1 | 7/2001 | Crosby, Jr. et al. |
| 6,263,141 B1 | 7/2001 | Smith |
| 6,265,680 B1 | 7/2001 | Robertson |
| 6,269,212 B1 | 7/2001 | Schiattone |
| 6,273,532 B1 | 8/2001 | Chen et al. |
| 6,275,641 B1 | 8/2001 | Daoud |
| 6,278,829 B1 | 8/2001 | BuAbbud et al. |
| 6,278,831 B1 | 8/2001 | Henderson et al. |
| D448,005 S | 9/2001 | Klein, Jr. et al. |
| 6,289,618 B1 | 9/2001 | Kump et al. |
| 6,292,614 B1 | 9/2001 | Smith et al. |
| 6,301,424 B1 | 10/2001 | Hwang |
| 6,305,848 B1 | 10/2001 | Gregory |
| 6,307,997 B1 | 10/2001 | Walters et al. |
| 6,318,824 B1 | 11/2001 | LaGrotta et al. |
| 6,321,017 B1 | 11/2001 | Janus et al. |
| 6,322,279 B1 | 11/2001 | Yamamoto et al. |
| 6,324,575 B1 | 11/2001 | Jain et al. |
| 6,325,549 B1 | 12/2001 | Shevchuk |
| 6,327,059 B1 | 12/2001 | Bhalla et al. |
| RE37,489 E | 1/2002 | Anton et al. |
| 6,343,313 B1 | 1/2002 | Salesky et al. |
| 6,344,615 B1 | 2/2002 | Nolf et al. |
| 6,347,888 B1 | 2/2002 | Puetz |
| 6,353,696 B1 | 3/2002 | Gordon et al. |
| 6,353,697 B1 | 3/2002 | Daoud |
| 6,357,712 B1 * | 3/2002 | Lu ............................... 248/291.1 |
| 6,359,228 B1 | 3/2002 | Strause et al. |
| 6,363,198 B1 | 3/2002 | Braga et al. |
| 6,363,200 B1 | 3/2002 | Thompson et al. |
| 6,370,309 B1 | 4/2002 | Daoud |
| 6,371,419 B1 | 4/2002 | Ohnuki |
| 6,375,129 B2 | 4/2002 | Koziol |
| 6,377,218 B1 | 4/2002 | Nelson et al. |
| 6,379,052 B1 | 4/2002 | De Jong et al. |
| 6,381,642 B1 | 4/2002 | O'Donnell et al. |
| 6,385,374 B2 | 5/2002 | Kropp |
| 6,385,381 B1 | 5/2002 | Janus et al. |
| 6,389,214 B1 | 5/2002 | Smith et al. |
| 6,392,140 B1 | 5/2002 | Yee et al. |
| 6,397,166 B1 | 5/2002 | Leung et al. |
| 6,398,149 B1 | 6/2002 | Hines et al. |
| 6,406,314 B1 | 6/2002 | Byrne |
| 6,410,850 B1 | 6/2002 | Abel et al. |
| 6,411,767 B1 | 6/2002 | Burrous et al. |
| 6,412,986 B1 | 7/2002 | Ngo et al. |
| 6,418,262 B1 | 7/2002 | Puetz et al. |
| 6,419,519 B1 | 7/2002 | Young |
| 6,424,781 B1 | 7/2002 | Puetz et al. |
| 6,425,694 B1 | 7/2002 | Szilagyi et al. |
| 6,427,045 B1 | 7/2002 | Matthes et al. |
| 6,431,762 B1 | 8/2002 | Taira et al. |
| 6,434,313 B1 | 8/2002 | Clapp, Jr. et al. |
| 6,438,310 B1 | 8/2002 | Lance et al. |
| 6,452,925 B1 | 9/2002 | Sistanizadeh et al. |
| 6,456,773 B1 | 9/2002 | Keys |
| 6,464,402 B1 | 10/2002 | Andrews et al. |
| 6,466,724 B1 | 10/2002 | Glover et al. |
| 6,469,905 B1 | 10/2002 | Hwang |
| D466,087 S | 11/2002 | Cuny et al. |
| 6,478,472 B1 | 11/2002 | Anderson et al. |
| 6,480,487 B1 | 11/2002 | Wegleitner et al. |
| 6,480,660 B1 | 11/2002 | Reitmeier et al. |
| 6,483,977 B2 | 11/2002 | Battey et al. |
| 6,484,958 B1 | 11/2002 | Xue et al. |
| 6,494,550 B1 | 12/2002 | Chen et al. |
| 6,496,640 B1 | 12/2002 | Harvey et al. |
| 6,504,988 B1 | 1/2003 | Trebesch et al. |
| 6,507,980 B2 | 1/2003 | Bremicker |
| 6,510,274 B1 | 1/2003 | Wu et al. |
| 6,532,332 B2 | 3/2003 | Solheid et al. |
| 6,533,472 B1 | 3/2003 | Dinh et al. |
| 6,535,397 B2 | 3/2003 | Clark et al. |
| 6,539,147 B1 | 3/2003 | Mahony |
| 6,539,160 B2 | 3/2003 | Battey et al. |
| 6,542,688 B1 | 4/2003 | Battey et al. |
| 6,544,075 B1 | 4/2003 | Liao |
| 6,550,977 B2 | 4/2003 | Hizuka |
| 6,554,485 B1 | 4/2003 | Beatty et al. |
| 6,560,334 B1 | 5/2003 | Mullaney et al. |
| 6,567,601 B2 | 5/2003 | Daoud et al. |
| 6,568,542 B1 | 5/2003 | Chen |
| 6,571,048 B1 | 5/2003 | Bechamps et al. |
| 6,577,595 B1 | 6/2003 | Counterman |
| 6,577,801 B2 | 6/2003 | Broderick et al. |
| 6,579,014 B2 | 6/2003 | Melton et al. |
| 6,584,267 B1 | 6/2003 | Caveney et al. |
| 6,585,423 B1 | 7/2003 | Vergeest |
| 6,587,630 B2 | 7/2003 | Spence et al. |
| 6,588,938 B1 | 7/2003 | Lampert et al. |
| 6,591,051 B2 | 7/2003 | Solheid et al. |
| 6,591,053 B2 | 7/2003 | Fritz |
| 6,592,266 B1 | 7/2003 | Hankins et al. |
| 6,597,670 B1 | 7/2003 | Tweedy et al. |
| 6,600,106 B2 | 7/2003 | Standish et al. |
| 6,600,866 B2 | 7/2003 | Gatica et al. |
| 6,601,997 B2 | 8/2003 | Ngo |
| 6,612,515 B1 | 9/2003 | Tinucci et al. |
| 6,612,874 B1 | 9/2003 | Stout et al. |
| 6,614,978 B1 | 9/2003 | Caveney |
| 6,614,980 B1 | 9/2003 | Mahony |
| 6,621,975 B2 | 9/2003 | Laporte et al. |
| 6,622,873 B2 | 9/2003 | Hegrenes et al. |
| 6,624,389 B1 | 9/2003 | Cox |
| 6,625,374 B2 | 9/2003 | Holman et al. |
| 6,625,375 B1 | 9/2003 | Mahony |
| 6,631,237 B2 | 10/2003 | Knudsen et al. |
| 6,640,042 B2 | 10/2003 | Araki et al. |
| RE38,311 E | 11/2003 | Wheeler |
| 6,644,863 B1 | 11/2003 | Azami et al. |
| 6,647,197 B1 | 11/2003 | Marrs et al. |
| 6,648,520 B2 | 11/2003 | McDonald et al. |
| 6,654,536 B2 | 11/2003 | Battey et al. |
| 6,668,127 B1 | 12/2003 | Mahony |
| 6,669,149 B2 | 12/2003 | Akizuki |
| 6,677,520 B1 | 1/2004 | Kim et al. |
| 6,679,604 B1 | 1/2004 | Bove et al. |
| 6,687,450 B1 | 2/2004 | Kempeneers et al. |
| 6,693,552 B1 | 2/2004 | Herzig et al. |
| 6,695,620 B1 | 2/2004 | Huang |
| 6,701,056 B2 | 3/2004 | Burek et al. |
| 6,710,366 B1 | 3/2004 | Lee et al. |
| 6,715,619 B2 | 4/2004 | Kim et al. |
| 6,719,149 B2 | 4/2004 | Tomino |
| 6,721,482 B1 | 4/2004 | Glynn |
| 6,728,462 B2 | 4/2004 | Wu et al. |
| 6,741,784 B1 | 5/2004 | Guan |
| 6,741,785 B2 | 5/2004 | Barthel et al. |
| 6,746,037 B1 | 6/2004 | Kaplenski et al. |
| 6,748,154 B2 | 6/2004 | O'Leary et al. |
| 6,748,155 B2 | 6/2004 | Kim et al. |
| 6,758,600 B2 | 7/2004 | Del Grosso et al. |
| 6,768,860 B2 | 7/2004 | Liberty |
| 6,771,861 B2 | 8/2004 | Wagner et al. |
| 6,773,297 B2 | 8/2004 | Komiya |
| 6,778,525 B1 | 8/2004 | Baum et al. |
| 6,778,752 B2 | 8/2004 | Laporte et al. |
| 6,786,647 B1 | 9/2004 | Hinds et al. |
| 6,786,743 B2 | 9/2004 | Huang |
| 6,786,896 B1 | 9/2004 | Madhani et al. |
| 6,788,871 B2 | 9/2004 | Taylor |

(56) References Cited

U.S. PATENT DOCUMENTS

| | | |
|---|---|---|
| 6,792,190 B2 | 9/2004 | Xin et al. |
| 6,792,191 B1 | 9/2004 | Clapp, Jr. et al. |
| 6,798,751 B1 | 9/2004 | Voit et al. |
| 6,804,447 B2 | 10/2004 | Smith et al. |
| 6,810,194 B2 | 10/2004 | Griffiths et al. |
| 6,813,412 B2 | 11/2004 | Lin |
| 6,816,660 B2 | 11/2004 | Nashimoto |
| 6,818,834 B1 | 11/2004 | Lin |
| 6,819,856 B2 | 11/2004 | Dagley et al. |
| 6,819,857 B2 | 11/2004 | Douglas et al. |
| 6,822,874 B1 | 11/2004 | Marler |
| 6,826,174 B1 | 11/2004 | Erekson et al. |
| 6,826,346 B2 | 11/2004 | Sloan et al. |
| 6,826,631 B2 | 11/2004 | Webb |
| 6,830,489 B2 | 12/2004 | Aoyama |
| 6,839,428 B2 | 1/2005 | Brower et al. |
| 6,839,438 B1 | 1/2005 | Riegelsberger et al. |
| 6,840,815 B2 | 1/2005 | Musolf et al. |
| 6,845,207 B2 | 1/2005 | Schray |
| 6,847,614 B2 | 1/2005 | Banker et al. |
| 6,848,862 B1 | 2/2005 | Schlig |
| 6,850,685 B2 | 2/2005 | Tinucci et al. |
| 6,853,637 B1 | 2/2005 | Norrell et al. |
| 6,854,894 B1 | 2/2005 | Yunker et al. |
| 6,856,334 B1 | 2/2005 | Fukui |
| 6,856,505 B1 | 2/2005 | Venegas et al. |
| 6,863,444 B2 | 3/2005 | Anderson et al. |
| 6,865,331 B2 | 3/2005 | Mertesdorf |
| 6,865,334 B2 | 3/2005 | Cooke et al. |
| 6,866,541 B2 | 3/2005 | Barker et al. |
| 6,868,216 B1 | 3/2005 | Gehrke |
| 6,869,227 B2 | 3/2005 | Del Grosso et al. |
| 6,870,734 B2 | 3/2005 | Mertesdorf et al. |
| 6,870,997 B2 | 3/2005 | Cooke |
| 6,879,545 B2 | 4/2005 | Cooke et al. |
| 6,915,058 B2 | 7/2005 | Pons |
| 6,920,273 B2 | 7/2005 | Knudsen |
| 6,920,274 B2 | 7/2005 | Rapp et al. |
| 6,923,406 B2 | 8/2005 | Akizuki |
| 6,925,241 B2 | 8/2005 | Bohle et al. |
| 6,934,451 B2 | 8/2005 | Cooke |
| 6,934,456 B2 | 8/2005 | Ferris et al. |
| 6,935,598 B2 | 8/2005 | Sono et al. |
| 6,937,807 B2 | 8/2005 | Franklin et al. |
| 6,944,383 B1 | 9/2005 | Herzog et al. |
| 6,944,389 B2 | 9/2005 | Giraud et al. |
| 6,945,701 B2 | 9/2005 | Trezza et al. |
| 6,952,530 B2 | 10/2005 | Helvajian et al. |
| 6,963,690 B1 | 11/2005 | Kassal et al. |
| 6,968,107 B2 | 11/2005 | Belardi et al. |
| 6,968,111 B2 | 11/2005 | Trebesch et al. |
| 6,985,665 B2 | 1/2006 | Baechtle |
| 6,993,237 B2 | 1/2006 | Cooke et al. |
| 7,000,784 B2 | 2/2006 | Canty et al. |
| 7,005,582 B2 | 2/2006 | Muller et al. |
| 7,006,748 B2 | 2/2006 | Dagley et al. |
| 7,007,296 B2 | 2/2006 | Rakib |
| 7,025,275 B2 | 4/2006 | Huang et al. |
| 7,027,695 B2 | 4/2006 | Cooke et al. |
| 7,027,706 B2 | 4/2006 | Diaz et al. |
| 7,031,588 B2 | 4/2006 | Cowley et al. |
| 7,035,510 B2 | 4/2006 | Zimmel et al. |
| 7,038,137 B2 | 5/2006 | Grubish et al. |
| 7,048,447 B1 | 5/2006 | Patel et al. |
| 7,054,513 B2 | 5/2006 | Herz et al. |
| 7,066,748 B2 | 6/2006 | Bricaud et al. |
| 7,068,907 B2 | 6/2006 | Schray |
| 7,070,459 B2 | 7/2006 | Denovich et al. |
| 7,077,710 B2 | 7/2006 | Haggay et al. |
| 7,079,744 B2 | 7/2006 | Douglas et al. |
| 7,090,406 B2 | 8/2006 | Melton et al. |
| 7,090,407 B2 | 8/2006 | Melton et al. |
| 7,094,095 B1 | 8/2006 | Caveney |
| 7,097,047 B2 | 8/2006 | Lee et al. |
| 7,101,093 B2 | 9/2006 | Hsiao et al. |
| 7,102,884 B2 | 9/2006 | Mertesdorf et al. |
| 7,103,255 B2 | 9/2006 | Reagan et al. |
| 7,110,654 B2 | 9/2006 | Dillat |
| 7,111,990 B2 | 9/2006 | Melton et al. |
| 7,113,679 B2 | 9/2006 | Melton et al. |
| 7,113,686 B2 | 9/2006 | Bellekens et al. |
| 7,113,687 B2 | 9/2006 | Womack et al. |
| 7,116,491 B1 | 10/2006 | Willey et al. |
| 7,116,883 B2 | 10/2006 | Kline et al. |
| 7,118,281 B2 | 10/2006 | Chiu et al. |
| 7,118,405 B2 | 10/2006 | Peng |
| 7,120,347 B2 | 10/2006 | Blackwell, Jr. et al. |
| 7,120,348 B2 | 10/2006 | Trebesch et al. |
| 7,120,349 B2 | 10/2006 | Elliott |
| 7,127,143 B2 | 10/2006 | Elkins, II et al. |
| 7,128,471 B2 | 10/2006 | Wilson |
| 7,136,555 B2 | 11/2006 | Theuerkorn et al. |
| 7,139,462 B1 | 11/2006 | Richtman |
| 7,140,903 B2 | 11/2006 | Pulizzi et al. |
| 7,147,383 B2 | 12/2006 | Sullivan |
| 7,171,099 B2 | 1/2007 | Barnes et al. |
| 7,171,121 B1 | 1/2007 | Skarica et al. |
| 7,181,142 B1 | 2/2007 | Xu et al. |
| 7,186,134 B2 | 3/2007 | Togami et al. |
| 7,193,783 B2 | 3/2007 | Willey et al. |
| 7,194,181 B2 | 3/2007 | Holmberg et al. |
| 7,195,521 B2 | 3/2007 | Musolf et al. |
| 7,200,314 B2 | 4/2007 | Womack et al. |
| 7,200,316 B2 | 4/2007 | Giraud et al. |
| 7,201,595 B1 | 4/2007 | Morello |
| 7,217,040 B2 | 5/2007 | Crews et al. |
| 7,218,526 B2 | 5/2007 | Mayer |
| 7,220,065 B2 | 5/2007 | Han et al. |
| 7,221,832 B2 | 5/2007 | Tinucci |
| 7,228,036 B2 | 6/2007 | Elkins, II et al. |
| 7,228,047 B1 | 6/2007 | Szilagyi et al. |
| 7,231,125 B2 | 6/2007 | Douglas et al. |
| 7,234,878 B2 | 6/2007 | Yamauchi et al. |
| 7,236,677 B2 | 6/2007 | Escoto et al. |
| 7,239,789 B2 | 7/2007 | Grubish et al. |
| 7,245,809 B1 | 7/2007 | Gniadek et al. |
| 7,259,325 B2 | 8/2007 | Pincu et al. |
| 7,266,283 B2 | 9/2007 | Kline et al. |
| 7,270,485 B1 | 9/2007 | Robinson et al. |
| 7,272,291 B2 | 9/2007 | Bayazit et al. |
| 7,274,852 B1 | 9/2007 | Smrha et al. |
| 7,284,785 B2 | 10/2007 | Gotou et al. |
| 7,287,913 B2 | 10/2007 | Keenum et al. |
| 7,289,731 B2 | 10/2007 | Thinguldstad |
| 7,292,769 B2 | 11/2007 | Watanabe et al. |
| 7,298,950 B2 | 11/2007 | Frohlich |
| 7,300,216 B2 | 11/2007 | Morse et al. |
| 7,300,308 B2 | 11/2007 | Laursen et al. |
| 7,302,149 B2 | 11/2007 | Swam et al. |
| 7,302,153 B2 | 11/2007 | Thom |
| 7,302,154 B2 | 11/2007 | Trebesch et al. |
| 7,308,184 B2 | 12/2007 | Barnes et al. |
| 7,310,471 B2 | 12/2007 | Bayazit et al. |
| 7,310,472 B2 | 12/2007 | Haberman |
| 7,315,681 B2 | 1/2008 | Kewitsch |
| 7,325,975 B2 | 2/2008 | Yamada et al. |
| 7,330,624 B2 | 2/2008 | Isenhour et al. |
| 7,330,625 B2 | 2/2008 | Barth |
| 7,330,626 B2 | 2/2008 | Kowalczyk et al. |
| 7,330,629 B2 | 2/2008 | Cooke et al. |
| 7,331,718 B2 | 2/2008 | Yazaki et al. |
| 7,340,145 B2 | 3/2008 | Allen |
| 7,349,615 B2 | 3/2008 | Frazier et al. |
| 7,352,946 B2 | 4/2008 | Heller et al. |
| 7,352,947 B2 | 4/2008 | Phung et al. |
| 7,373,071 B2 | 5/2008 | Douglas et al. |
| 7,376,321 B2 | 5/2008 | Bolster et al. |
| 7,376,323 B2 | 5/2008 | Zimmel |
| 7,391,952 B1 | 6/2008 | Ugolini et al. |
| 7,397,996 B2 | 7/2008 | Herzog et al. |
| 7,400,813 B2 | 7/2008 | Zimmel |
| 7,404,736 B2 | 7/2008 | Herbst et al. |
| 7,409,137 B2 | 8/2008 | Barnes |
| 7,414,198 B2 | 8/2008 | Stansbie et al. |

(56) References Cited

U.S. PATENT DOCUMENTS

| | | | |
|---|---|---|---|
| 7,417,188 B2 | 8/2008 | McNutt et al. |
| 7,418,182 B2 | 8/2008 | Krampotich |
| 7,418,184 B1 | 8/2008 | Gonzales et al. |
| 7,421,182 B2 | 9/2008 | Bayazit et al. |
| 7,428,363 B2 | 9/2008 | Leon et al. |
| 7,435,090 B1 | 10/2008 | Schriefer et al. |
| 7,437,049 B2 | 10/2008 | Krampotich |
| 7,439,453 B2 | 10/2008 | Murano et al. |
| 7,454,113 B2 | 11/2008 | Barnes |
| 7,460,757 B2 | 12/2008 | Hoehne et al. |
| 7,460,758 B2 | 12/2008 | Xin |
| 7,461,981 B2 | 12/2008 | Yow, Jr. et al. |
| 7,462,779 B2 | 12/2008 | Caveney et al. |
| 7,463,810 B2 | 12/2008 | Bayazit et al. |
| 7,463,811 B2 | 12/2008 | Trebesch et al. |
| 7,469,090 B2 | 12/2008 | Ferris et al. |
| 7,471,867 B2 | 12/2008 | Vogel et al. |
| 7,474,828 B2 | 1/2009 | Leon et al. |
| 7,477,824 B2 | 1/2009 | Reagan et al. |
| 7,477,826 B2 | 1/2009 | Mullaney et al. |
| 7,480,438 B2 | 1/2009 | Douglas et al. |
| 7,488,205 B2 | 2/2009 | Spisany et al. |
| 7,493,002 B2 | 2/2009 | Coburn et al. |
| 7,496,269 B1 | 2/2009 | Lee |
| 7,499,622 B2 | 3/2009 | Castonguay et al. |
| 7,499,623 B2 | 3/2009 | Barnes et al. |
| 7,507,111 B2 | 3/2009 | Togami et al. |
| 7,509,015 B2 | 3/2009 | Murano |
| 7,509,016 B2 | 3/2009 | Smith et al. |
| 7,510,421 B2 | 3/2009 | Fransen et al. |
| 7,522,804 B2 | 4/2009 | Araki et al. |
| 7,523,898 B1 | 4/2009 | Barry et al. |
| 7,526,171 B2 | 4/2009 | Caveney et al. |
| 7,526,172 B2 | 4/2009 | Gniadek et al. |
| 7,526,174 B2 | 4/2009 | Leon et al. |
| 7,529,458 B2 | 5/2009 | Spisany et al. |
| 7,534,958 B2 | 5/2009 | McNutt et al. |
| 7,536,075 B2 | 5/2009 | Zimmel |
| 7,540,666 B2 | 6/2009 | Luther et al. |
| 7,542,645 B1 | 6/2009 | Hua et al. |
| 7,544,085 B2 | 6/2009 | Baldwin et al. |
| 7,552,899 B2 | 6/2009 | Chen et al. |
| 7,555,193 B2 | 6/2009 | Rapp et al. |
| 7,558,458 B2 | 7/2009 | Gronvall et al. |
| 7,565,051 B2 | 7/2009 | Vongseng |
| 7,567,744 B2 | 7/2009 | Krampotich et al. |
| 7,570,860 B2 | 8/2009 | Smrha et al. |
| 7,570,861 B2 | 8/2009 | Smrha et al. |
| 7,577,331 B2 | 8/2009 | Laurisch et al. |
| 7,596,293 B2 | 9/2009 | Isenhour et al. |
| 7,603,020 B1 | 10/2009 | Wakileh et al. |
| 7,607,938 B2 | 10/2009 | Clark et al. |
| 7,609,967 B2 | 10/2009 | Hochbaum et al. |
| 7,613,377 B2 | 11/2009 | Gonzales et al. |
| 7,614,903 B1 | 11/2009 | Huang |
| 7,620,287 B2 | 11/2009 | Appenzeller et al. |
| 7,641,398 B2 | 1/2010 | O'Riorden et al. |
| 7,668,430 B2 | 2/2010 | McClellan et al. |
| 7,668,433 B2 | 2/2010 | Bayazit et al. |
| 7,672,561 B1 | 3/2010 | Keith et al. |
| 7,676,135 B2 | 3/2010 | Chen |
| 7,689,079 B2 | 3/2010 | Burnham et al. |
| 7,694,926 B2 | 4/2010 | Allen et al. |
| 7,697,811 B2 | 4/2010 | Murano et al. |
| 7,706,294 B2 | 4/2010 | Natarajan et al. |
| 7,715,125 B2 | 5/2010 | Willey |
| 7,715,683 B2 | 5/2010 | Kowalczyk et al. |
| 7,734,138 B2 | 6/2010 | Bloodworth et al. |
| 7,740,409 B2 | 6/2010 | Bolton et al. |
| 7,743,495 B2 | 6/2010 | Mori et al. |
| 7,751,674 B2 | 7/2010 | Hill |
| 7,751,675 B2 | 7/2010 | Holmberg et al. |
| 7,756,371 B1 | 7/2010 | Burnham et al. |
| 7,756,382 B2 | 7/2010 | Saravanos et al. |
| 7,760,984 B2 | 7/2010 | Solheid et al. |
| 7,764,858 B2 | 7/2010 | Bayazit et al. |
| 7,764,859 B2 | 7/2010 | Krampotich et al. |
| 7,769,266 B2 * | 8/2010 | Morris .......................... 385/135 |
| 7,805,044 B2 | 9/2010 | Reagan et al. |
| 7,809,232 B2 | 10/2010 | Reagan et al. |
| 7,809,235 B2 | 10/2010 | Reagan et al. |
| 7,811,136 B1 | 10/2010 | Hsieh et al. |
| 7,822,310 B2 | 10/2010 | Castonguay et al. |
| 7,837,495 B2 | 11/2010 | Baldwin et al. |
| 7,850,372 B2 | 12/2010 | Nishimura et al. |
| 7,853,112 B2 | 12/2010 | Zimmel et al. |
| 7,856,166 B2 | 12/2010 | Biribuze et al. |
| 7,862,369 B2 | 1/2011 | Gimenes et al. |
| 7,869,685 B2 | 1/2011 | Hendrickson et al. |
| 7,876,580 B2 | 1/2011 | Mayer |
| 7,899,298 B2 | 3/2011 | Cox et al. |
| 7,914,332 B2 | 3/2011 | Song et al. |
| 7,942,589 B2 | 5/2011 | Yazaki et al. |
| 7,945,135 B2 | 5/2011 | Cooke et al. |
| 7,945,136 B2 | 5/2011 | Cooke et al. |
| 7,945,138 B2 | 5/2011 | Hill et al. |
| 7,970,250 B2 | 6/2011 | Morris |
| 7,991,252 B2 | 8/2011 | Cheng et al. |
| 8,009,959 B2 | 8/2011 | Barnes et al. |
| 8,014,171 B2 | 9/2011 | Kelly et al. |
| 8,014,646 B2 | 9/2011 | Keith et al. |
| 8,020,813 B1 | 9/2011 | Clark et al. |
| 8,059,932 B2 | 11/2011 | Hill et al. |
| 8,093,499 B2 | 1/2012 | Hoffer et al. |
| 8,107,785 B2 | 1/2012 | Berglund et al. |
| 8,131,126 B2 | 3/2012 | Kowalczyk et al. |
| 8,184,938 B2 | 5/2012 | Cooke et al. |
| 8,206,043 B2 | 6/2012 | Thirugnanam et al. |
| 8,206,058 B2 | 6/2012 | Vrondran et al. |
| 8,220,881 B2 | 7/2012 | Keith |
| 8,226,305 B2 | 7/2012 | Thirugnanam et al. |
| 8,249,410 B2 | 8/2012 | Andrus et al. |
| 8,251,591 B2 | 8/2012 | Barnes et al. |
| 8,270,798 B2 | 9/2012 | Dagley et al. |
| 8,280,216 B2 | 10/2012 | Cooke et al. |
| 8,285,104 B2 | 10/2012 | Davis et al. |
| 8,301,004 B2 | 10/2012 | Cooke et al. |
| 8,331,752 B2 | 12/2012 | Biribuze |
| 8,353,494 B2 | 1/2013 | Peng et al. |
| 8,369,679 B2 | 2/2013 | Wakileh et al. |
| 8,391,666 B2 | 3/2013 | Hetzer et al. |
| 8,472,773 B2 | 6/2013 | de Jong |
| 8,491,331 B2 * | 7/2013 | Follingstad .................. 439/534 |
| 8,528,872 B2 | 9/2013 | Mattlin et al. |
| 8,537,477 B2 | 9/2013 | Shioda |
| 8,538,226 B2 | 9/2013 | Makrides-Saravanos et al. |
| 8,559,783 B2 | 10/2013 | Campos et al. |
| 8,824,850 B2 | 9/2014 | Garcia et al. |
| 2001/0010741 A1 | 8/2001 | Hizuka |
| 2001/0029125 A1 | 10/2001 | Morita et al. |
| 2002/0010818 A1 | 1/2002 | Wei et al. |
| 2002/0012353 A1 | 1/2002 | Gerszberg et al. |
| 2002/0014571 A1 | 2/2002 | Thompson |
| 2002/0034290 A1 | 3/2002 | Pershan |
| 2002/0037139 A1 | 3/2002 | Asao et al. |
| 2002/0064364 A1 | 5/2002 | Battey et al. |
| 2002/0131730 A1 | 9/2002 | Keeble et al. |
| 2002/0136519 A1 | 9/2002 | Tinucci et al. |
| 2002/0141724 A1 | 10/2002 | Ogawa et al. |
| 2002/0150372 A1 | 10/2002 | Schray |
| 2002/0172467 A1 | 11/2002 | Anderson et al. |
| 2002/0180163 A1 | 12/2002 | Muller et al. |
| 2002/0181918 A1 | 12/2002 | Spence et al. |
| 2002/0181922 A1 | 12/2002 | Xin et al. |
| 2002/0191939 A1 | 12/2002 | Daoud et al. |
| 2002/0194596 A1 | 12/2002 | Srivastava |
| 2003/0002802 A1 | 1/2003 | Trezza et al. |
| 2003/0007743 A1 | 1/2003 | Asada |
| 2003/0007767 A1 | 1/2003 | Douglas et al. |
| 2003/0011855 A1 | 1/2003 | Fujiwara |
| 2003/0021539 A1 | 1/2003 | Kwon et al. |
| 2003/0036748 A1 | 2/2003 | Cooper et al. |
| 2003/0051026 A1 | 3/2003 | Carter et al. |
| 2003/0066998 A1 | 4/2003 | Lee |

(56) References Cited

U.S. PATENT DOCUMENTS

| | | |
|---|---|---|
| 2003/0086675 A1 | 5/2003 | Wu et al. |
| 2003/0095753 A1 | 5/2003 | Wada et al. |
| 2003/0123834 A1 | 7/2003 | Burek et al. |
| 2003/0147604 A1 | 8/2003 | Tapia et al. |
| 2003/0156552 A1 | 8/2003 | Banker et al. |
| 2003/0174996 A1 | 9/2003 | Henschel et al. |
| 2003/0180004 A1 | 9/2003 | Cox et al. |
| 2003/0180012 A1 | 9/2003 | Deane et al. |
| 2003/0183413 A1 | 10/2003 | Kato |
| 2003/0199201 A1 | 10/2003 | Mullaney et al. |
| 2003/0210882 A1 | 11/2003 | Barthel et al. |
| 2003/0223723 A1 | 12/2003 | Massey et al. |
| 2003/0223725 A1 | 12/2003 | Laporte et al. |
| 2003/0235387 A1 | 12/2003 | Dufour |
| 2004/0001717 A1 | 1/2004 | Bennett et al. |
| 2004/0013389 A1 | 1/2004 | Taylor |
| 2004/0013390 A1 | 1/2004 | Kim et al. |
| 2004/0022494 A1 | 2/2004 | Liddle et al. |
| 2004/0024934 A1 | 2/2004 | Webb |
| 2004/0067036 A1 | 4/2004 | Clark et al. |
| 2004/0074852 A1 | 4/2004 | Knudsen et al. |
| 2004/0086238 A1 | 5/2004 | Finona et al. |
| 2004/0086252 A1 | 5/2004 | Smith et al. |
| 2004/0120679 A1 | 6/2004 | Vincent et al. |
| 2004/0147159 A1 | 7/2004 | Urban et al. |
| 2004/0151465 A1 | 8/2004 | Krampotich et al. |
| 2004/0175090 A1 | 9/2004 | Vastmans et al. |
| 2004/0192115 A1 | 9/2004 | Bugg |
| 2004/0196841 A1 | 10/2004 | Tudor et al. |
| 2004/0208459 A1 | 10/2004 | Mizue et al. |
| 2004/0228598 A1 | 11/2004 | Allen et al. |
| 2004/0240827 A1 | 12/2004 | Daoud et al. |
| 2004/0240882 A1 | 12/2004 | Lipski et al. |
| 2004/0264873 A1 | 12/2004 | Smith et al. |
| 2005/0002633 A1 | 1/2005 | Solheid et al. |
| 2005/0008131 A1 | 1/2005 | Cook |
| 2005/0026497 A1 | 2/2005 | Holliday |
| 2005/0036749 A1 | 2/2005 | Vogel et al. |
| 2005/0067358 A1 | 3/2005 | Lee et al. |
| 2005/0069248 A1 | 3/2005 | Jasti et al. |
| 2005/0074990 A1 | 4/2005 | Shearman et al. |
| 2005/0076149 A1 | 4/2005 | McKown et al. |
| 2005/0083959 A1 | 4/2005 | Binder |
| 2005/0107086 A1 | 5/2005 | Tell et al. |
| 2005/0111809 A1 | 5/2005 | Giraud et al. |
| 2005/0123261 A1 | 6/2005 | Bellekens et al. |
| 2005/0129379 A1 | 6/2005 | Reagan et al. |
| 2005/0178573 A1 | 8/2005 | James |
| 2005/0201073 A1 | 9/2005 | Pincu et al. |
| 2005/0232566 A1 | 10/2005 | Rapp et al. |
| 2005/0233647 A1 | 10/2005 | Denovich et al. |
| 2005/0254757 A1 | 11/2005 | Ferretti, III et al. |
| 2005/0281526 A1 | 12/2005 | Vongseng et al. |
| 2005/0285493 A1 | 12/2005 | Hu et al. |
| 2006/0007562 A1 | 1/2006 | Willey et al. |
| 2006/0018448 A1 | 1/2006 | Stevens et al. |
| 2006/0018622 A1* | 1/2006 | Caveney et al. ............... 385/135 |
| 2006/0034048 A1 | 2/2006 | Xu |
| 2006/0039290 A1 | 2/2006 | Roden et al. |
| 2006/0044774 A1 | 3/2006 | Vasavda et al. |
| 2006/0045458 A1 | 3/2006 | Sasaki et al. |
| 2006/0072606 A1 | 4/2006 | Posthuma |
| 2006/0077968 A1 | 4/2006 | Pitsoulakis et al. |
| 2006/0093303 A1 | 5/2006 | Reagan et al. |
| 2006/0103270 A1 | 5/2006 | Bergesch et al. |
| 2006/0127026 A1 | 6/2006 | Beck |
| 2006/0133736 A1 | 6/2006 | Sullivan |
| 2006/0133759 A1 | 6/2006 | Mullaney et al. |
| 2006/0147172 A1 | 7/2006 | Luther et al. |
| 2006/0153517 A1 | 7/2006 | Reagan et al. |
| 2006/0160377 A1 | 7/2006 | Huang |
| 2006/0165365 A1 | 7/2006 | Feustel et al. |
| 2006/0165366 A1 | 7/2006 | Feustel et al. |
| 2006/0191700 A1 | 8/2006 | Herzog et al. |
| 2006/0193590 A1 | 8/2006 | Puetz et al. |
| 2006/0193591 A1 | 8/2006 | Rapp et al. |
| 2006/0198098 A1 | 9/2006 | Clark et al. |
| 2006/0204179 A1 | 9/2006 | Patel et al. |
| 2006/0215980 A1 | 9/2006 | Bayazit et al. |
| 2006/0225912 A1 | 10/2006 | Clark et al. |
| 2006/0228087 A1 | 10/2006 | Bayazit et al. |
| 2006/0269194 A1 | 11/2006 | Luther et al. |
| 2006/0269205 A1 | 11/2006 | Zimmel |
| 2006/0269206 A1 | 11/2006 | Zimmel |
| 2006/0269208 A1 | 11/2006 | Allen et al. |
| 2006/0275008 A1 | 12/2006 | Xin |
| 2006/0275009 A1 | 12/2006 | Ellison et al. |
| 2006/0285812 A1 | 12/2006 | Ferris et al. |
| 2007/0003204 A1 | 1/2007 | Makrides-Saravanos et al. |
| 2007/0025070 A1 | 2/2007 | Jiang et al. |
| 2007/0031099 A1 | 2/2007 | Herzog et al. |
| 2007/0033629 A1 | 2/2007 | McGranahan et al. |
| 2007/0047891 A1 | 3/2007 | Bayazit et al. |
| 2007/0047894 A1 | 3/2007 | Holmberg et al. |
| 2007/0058641 A1 | 3/2007 | Cicchetti et al. |
| 2007/0086723 A1 | 4/2007 | Sasaki et al. |
| 2007/0104447 A1 | 5/2007 | Allen |
| 2007/0110373 A1 | 5/2007 | Dudek et al. |
| 2007/0131628 A1 | 6/2007 | Mimlitch, III et al. |
| 2007/0183732 A1 | 8/2007 | Wittmeier et al. |
| 2007/0189692 A1 | 8/2007 | Zimmel et al. |
| 2007/0196071 A1 | 8/2007 | Laursen et al. |
| 2007/0221793 A1 | 9/2007 | Kusuda et al. |
| 2007/0237484 A1 | 10/2007 | Reagan et al. |
| 2007/0257159 A1 | 11/2007 | Nelson et al. |
| 2007/0266192 A1 | 11/2007 | Campini et al. |
| 2007/0274718 A1 | 11/2007 | Bridges et al. |
| 2008/0011514 A1 | 1/2008 | Zheng et al. |
| 2008/0025683 A1 | 1/2008 | Murano |
| 2008/0031585 A1 | 2/2008 | Solheid et al. |
| 2008/0063350 A1 | 3/2008 | Trebesch et al. |
| 2008/0068788 A1 | 3/2008 | Ozawa et al. |
| 2008/0069511 A1 | 3/2008 | Blackwell, Jr. et al. |
| 2008/0069512 A1 | 3/2008 | Barnes et al. |
| 2008/0078899 A1 | 4/2008 | Chen et al. |
| 2008/0080826 A1 | 4/2008 | Leon et al. |
| 2008/0080827 A1 | 4/2008 | Leon et al. |
| 2008/0080828 A1 | 4/2008 | Leon et al. |
| 2008/0085094 A1 | 4/2008 | Krampotich |
| 2008/0089656 A1 | 4/2008 | Wagner et al. |
| 2008/0095502 A1 | 4/2008 | McColloch |
| 2008/0095541 A1 | 4/2008 | Dallesasse |
| 2008/0100440 A1 | 5/2008 | Downie et al. |
| 2008/0106871 A1 | 5/2008 | James |
| 2008/0112681 A1 | 5/2008 | Battey et al. |
| 2008/0118207 A1 | 5/2008 | Yamamoto et al. |
| 2008/0121423 A1 | 5/2008 | Vogel et al. |
| 2008/0124039 A1 | 5/2008 | Gniadek et al. |
| 2008/0131068 A1 | 6/2008 | Mertesdorf et al. |
| 2008/0145013 A1 | 6/2008 | Escoto et al. |
| 2008/0152294 A1 | 6/2008 | Hirano et al. |
| 2008/0166094 A1 | 7/2008 | Bookbinder et al. |
| 2008/0166131 A1 | 7/2008 | Hudgins et al. |
| 2008/0175541 A1 | 7/2008 | Lu et al. |
| 2008/0175550 A1 | 7/2008 | Coburn et al. |
| 2008/0175551 A1 | 7/2008 | Smrha et al. |
| 2008/0175552 A1 | 7/2008 | Smrha et al. |
| 2008/0193091 A1 | 8/2008 | Herbst |
| 2008/0205823 A1 | 8/2008 | Luther et al. |
| 2008/0205843 A1 | 8/2008 | Castonguay et al. |
| 2008/0205844 A1 | 8/2008 | Castonguay et al. |
| 2008/0212928 A1 | 9/2008 | Kowalczyk et al. |
| 2008/0219632 A1 | 9/2008 | Smith et al. |
| 2008/0219634 A1 | 9/2008 | Rapp et al. |
| 2008/0236858 A1 | 10/2008 | Quijano |
| 2008/0247723 A1 | 10/2008 | Herzog et al. |
| 2008/0267573 A1 | 10/2008 | Douglas et al. |
| 2008/0285934 A1 | 11/2008 | Standish et al. |
| 2008/0292261 A1 | 11/2008 | Kowalczyk et al. |
| 2008/0296060 A1* | 12/2008 | Hawley et al. ............... 174/535 |
| 2008/0298763 A1 | 12/2008 | Appenzeller et al. |
| 2008/0310810 A1 | 12/2008 | Gallagher |
| 2009/0010607 A1 | 1/2009 | Elisson et al. |
| 2009/0016685 A1 | 1/2009 | Hudgins et al. |

(56) References Cited

U.S. PATENT DOCUMENTS

| | | |
|---|---|---|
| 2009/0022470 A1 | 1/2009 | Krampotich |
| 2009/0038845 A1* | 2/2009 | Fransen et al. ............. 174/72 R |
| 2009/0060439 A1 | 3/2009 | Cox et al. |
| 2009/0060440 A1 | 3/2009 | Wright et al. |
| 2009/0067800 A1 | 3/2009 | Vazquez et al. |
| 2009/0074371 A1 | 3/2009 | Bayazit et al. |
| 2009/0080849 A1 | 3/2009 | Hankins et al. |
| 2009/0097813 A1 | 4/2009 | Hill |
| 2009/0110347 A1 | 4/2009 | Jacobsson |
| 2009/0121092 A1 | 5/2009 | Keith |
| 2009/0136194 A1 | 5/2009 | Barnes |
| 2009/0136195 A1 | 5/2009 | Smrha et al. |
| 2009/0136196 A1 | 5/2009 | Trebesch et al. |
| 2009/0146342 A1 | 6/2009 | Haney et al. |
| 2009/0148117 A1 | 6/2009 | Laurisch |
| 2009/0166404 A1 | 7/2009 | German et al. |
| 2009/0169163 A1 | 7/2009 | Abbott, III et al. |
| 2009/0175588 A1 | 7/2009 | Brandt et al. |
| 2009/0180749 A1 | 7/2009 | Douglas et al. |
| 2009/0184221 A1 | 7/2009 | Sculler |
| 2009/0185782 A1 | 7/2009 | Parikh et al. |
| 2009/0191891 A1 | 7/2009 | Ma et al. |
| 2009/0194647 A1 | 8/2009 | Keith |
| 2009/0196563 A1 | 8/2009 | Mullsteff et al. |
| 2009/0202214 A1 | 8/2009 | Holmberg et al. |
| 2009/0207577 A1 | 8/2009 | Fransen et al. |
| 2009/0208178 A1 | 8/2009 | Kowalczyk et al. |
| 2009/0208210 A1 | 8/2009 | Trojer et al. |
| 2009/0212679 A1 | 8/2009 | Frousiakis et al. |
| 2009/0214171 A1 | 8/2009 | Coburn et al. |
| 2009/0220200 A1 | 9/2009 | Sheau Tung Wong et al. |
| 2009/0220204 A1 | 9/2009 | Ruiz |
| 2009/0226142 A1 | 9/2009 | Barnes et al. |
| 2009/0238531 A1 | 9/2009 | Holmberg et al. |
| 2009/0245743 A1 | 10/2009 | Cote et al. |
| 2009/0252472 A1 | 10/2009 | Solheid et al. |
| 2009/0257726 A1 | 10/2009 | Redmann et al. |
| 2009/0257727 A1 | 10/2009 | Laurisch et al. |
| 2009/0257754 A1 | 10/2009 | Theodoras, II et al. |
| 2009/0263096 A1 | 10/2009 | Solheid et al. |
| 2009/0263122 A1 | 10/2009 | Helkey et al. |
| 2009/0267865 A1 | 10/2009 | Miller et al. |
| 2009/0269016 A1 | 10/2009 | Korampally et al. |
| 2009/0269018 A1 | 10/2009 | Frohlich et al. |
| 2009/0269019 A1 | 10/2009 | Andrus et al. |
| 2009/0274429 A1 | 11/2009 | Krampotich et al. |
| 2009/0274430 A1 | 11/2009 | Krampotich et al. |
| 2009/0274432 A1 | 11/2009 | Iwaya |
| 2009/0290842 A1 | 11/2009 | Bran de Leon et al. |
| 2009/0290843 A1 | 11/2009 | Reagan et al. |
| 2009/0297111 A1 | 12/2009 | Reagan et al. |
| 2009/0304342 A1 | 12/2009 | Adomeit et al. |
| 2009/0324189 A1 | 12/2009 | Hill et al. |
| 2010/0003000 A1 | 1/2010 | Rapp et al. |
| 2010/0012671 A1 | 1/2010 | Vrondran et al. |
| 2010/0027953 A1 | 2/2010 | Russell |
| 2010/0054681 A1 | 3/2010 | Biribuze et al. |
| 2010/0054682 A1 | 3/2010 | Cooke et al. |
| 2010/0054683 A1 | 3/2010 | Cooke et al. |
| 2010/0054684 A1 | 3/2010 | Cooke et al. |
| 2010/0054685 A1 | 3/2010 | Cooke et al. |
| 2010/0054686 A1 | 3/2010 | Cooke et al. |
| 2010/0054687 A1 | 3/2010 | Ye et al. |
| 2010/0061693 A1 | 3/2010 | Bran de Leon et al. |
| 2010/0074587 A1 | 3/2010 | Loeffelholz et al. |
| 2010/0080517 A1 | 4/2010 | Cline et al. |
| 2010/0086267 A1 | 4/2010 | Cooke et al. |
| 2010/0086274 A1 | 4/2010 | Keith |
| 2010/0111483 A1 | 5/2010 | Reinhardt et al. |
| 2010/0119201 A1 | 5/2010 | Smrha et al. |
| 2010/0129035 A1 | 5/2010 | Teo |
| 2010/0142544 A1 | 6/2010 | Chapel et al. |
| 2010/0142910 A1 | 6/2010 | Hill et al. |
| 2010/0150518 A1 | 6/2010 | Leon et al. |
| 2010/0158467 A1 | 6/2010 | Hou et al. |
| 2010/0166377 A1 | 7/2010 | Nair et al. |
| 2010/0178022 A1 | 7/2010 | Schroeder et al. |
| 2010/0202740 A1 | 8/2010 | Barlowe et al. |
| 2010/0202745 A1 | 8/2010 | Sokolowski et al. |
| 2010/0202748 A1 | 8/2010 | Pierce et al. |
| 2010/0220967 A1 | 9/2010 | Cooke et al. |
| 2010/0220968 A1 | 9/2010 | Dagley et al. |
| 2010/0247051 A1 | 9/2010 | Kowalczyk et al. |
| 2010/0266245 A1 | 10/2010 | Sabo |
| 2010/0278499 A1 | 11/2010 | Mures et al. |
| 2010/0296790 A1 | 11/2010 | Cooke et al. |
| 2010/0296791 A1 | 11/2010 | Makrides-Saravanos et al. |
| 2010/0310225 A1 | 12/2010 | Anderson et al. |
| 2010/0310226 A1 | 12/2010 | Wakileh et al. |
| 2010/0316334 A1 | 12/2010 | Kewitsch |
| 2010/0322554 A1 | 12/2010 | Barnes et al. |
| 2010/0322579 A1 | 12/2010 | Cooke et al. |
| 2010/0322580 A1 | 12/2010 | Beamon et al. |
| 2010/0322581 A1 | 12/2010 | Cooke et al. |
| 2010/0322582 A1 | 12/2010 | Cooke et al. |
| 2010/0322583 A1 | 12/2010 | Cooke et al. |
| 2010/0329624 A1 | 12/2010 | Zhou et al. |
| 2011/0008004 A1 | 1/2011 | Liao et al. |
| 2011/0058786 A1 | 3/2011 | Zimmel |
| 2011/0069931 A1 | 3/2011 | Cote et al. |
| 2011/0073730 A1 | 3/2011 | Kitchen |
| 2011/0085774 A1 | 4/2011 | Murphy et al. |
| 2011/0085776 A1 | 4/2011 | Biribuze et al. |
| 2011/0097053 A1 | 4/2011 | Smith et al. |
| 2011/0097977 A1 | 4/2011 | Bubnick et al. |
| 2011/0129185 A1 | 6/2011 | Lewallen et al. |
| 2011/0129186 A1 | 6/2011 | Lewallen et al. |
| 2011/0186532 A1* | 8/2011 | Wu ................................. 211/26 |
| 2011/0192631 A1 | 8/2011 | Burek et al. |
| 2011/0211799 A1 | 9/2011 | Conner et al. |
| 2011/0217014 A1 | 9/2011 | Dominique |
| 2011/0217016 A1 | 9/2011 | Mullsteff |
| 2011/0222821 A1 | 9/2011 | Pitwon et al. |
| 2011/0249950 A1 | 10/2011 | Chapa Ramirez et al. |
| 2011/0268404 A1 | 11/2011 | Cote et al. |
| 2011/0268405 A1 | 11/2011 | Cote et al. |
| 2011/0268407 A1 | 11/2011 | Cowen et al. |
| 2011/0268408 A1 | 11/2011 | Giraud et al. |
| 2011/0268413 A1 | 11/2011 | Cote et al. |
| 2011/0280535 A1 | 11/2011 | Womack |
| 2011/0280537 A1 | 11/2011 | Cowen et al. |
| 2012/0025683 A1 | 2/2012 | Mattlin et al. |
| 2012/0051707 A1 | 3/2012 | Barnes et al. |
| 2012/0057838 A1 | 3/2012 | Hill et al. |
| 2012/0106899 A1 | 5/2012 | Choi |
| 2012/0183263 A1 | 7/2012 | Wu |
| 2012/0183289 A1 | 7/2012 | Lou et al. |
| 2012/0219263 A1 | 8/2012 | Beamon et al. |
| 2012/0288244 A1 | 11/2012 | Wu et al. |
| 2012/0288248 A1 | 11/2012 | Chapa Ramirez et al. |
| 2012/0301083 A1 | 11/2012 | Carter et al. |
| 2013/0004136 A1 | 1/2013 | Brower et al. |
| 2013/0058616 A1 | 3/2013 | Cote et al. |
| 2013/0077927 A1 | 3/2013 | O'Connor |
| 2013/0214108 A1 | 8/2013 | Irudayaraj et al. |
| 2013/0243386 A1 | 9/2013 | Pimentel et al. |
| 2013/0266282 A1 | 10/2013 | Cote et al. |
| 2013/0308916 A1 | 11/2013 | Buff et al. |
| 2014/0003782 A1 | 1/2014 | Blackwell, Jr. et al. |
| 2014/0010510 A1 | 1/2014 | Blackard |
| 2014/0112628 A1 | 4/2014 | Keenum et al. |

FOREIGN PATENT DOCUMENTS

| | | |
|---|---|---|
| CA | 2186314 A1 | 4/1997 |
| CA | 2765835 A1 | 1/2011 |
| CH | 688705 A5 | 1/1998 |
| CN | 102460258 A | 5/2012 |
| DE | 8711970 U1 | 10/1987 |
| DE | 3726718 A1 | 2/1989 |
| DE | 3726719 A1 | 2/1989 |
| DE | 4030301 A1 | 3/1992 |
| DE | 4231181 C1 | 8/1993 |
| DE | 20115940 U1 | 1/2002 |

(56) References Cited

FOREIGN PATENT DOCUMENTS

| | | |
|---|---|---|
| DE | 10338848 A1 | 3/2005 |
| DE | 202005009932 U1 | 11/2005 |
| DE | 202007000556 U1 | 10/2007 |
| DE | 102007024476 A1 | 11/2008 |
| DE | 202010009385 U1 | 9/2010 |
| EP | 29512 A1 | 6/1981 |
| EP | 0105597 A2 | 4/1984 |
| EP | 0250900 A2 | 1/1988 |
| EP | 0408266 A2 | 1/1991 |
| EP | 0474091 A1 | 8/1991 |
| EP | 0468671 A1 | 1/1992 |
| EP | 0490698 A1 | 6/1992 |
| EP | 0529830 A1 | 3/1993 |
| EP | 0544004 A1 | 6/1993 |
| EP | 0547778 A1 | 6/1993 |
| EP | 0581527 A1 | 2/1994 |
| EP | 0620462 A1 | 10/1994 |
| EP | 0693699 A1 | 1/1996 |
| EP | 0720322 A2 | 7/1996 |
| EP | 0776557 B1 | 6/1997 |
| EP | 0940700 A2 | 9/1999 |
| EP | 0949522 A2 | 10/1999 |
| EP | 1041417 A2 | 10/2000 |
| EP | 1056177 A1 | 11/2000 |
| EP | 1065542 A1 | 1/2001 |
| EP | 1162485 A2 | 12/2001 |
| EP | 1203974 A2 | 5/2002 |
| EP | 1289319 A2 | 3/2003 |
| EP | 1310816 A2 | 5/2003 |
| EP | 1316829 A2 | 6/2003 |
| EP | 1367308 A1 | 12/2003 |
| EP | 1621907 A1 | 2/2006 |
| EP | 1777563 A1 | 4/2007 |
| EP | 2060942 A2 | 5/2009 |
| EP | 2159613 A2 | 3/2010 |
| FR | 1586331 A | 2/1970 |
| FR | 2123728 A5 | 9/1972 |
| FR | 2378378 A1 | 8/1978 |
| GB | 2241591 A | 9/1991 |
| GB | 2277812 A | 11/1994 |
| GB | 2367379 A | 4/2002 |
| GB | 2377839 A | 1/2003 |
| JP | 3060994 A | 3/1991 |
| JP | 3172806 A | 7/1991 |
| JP | 3281378 A | 12/1991 |
| JP | 5045541 A | 2/1993 |
| JP | 06018749 A | 1/1994 |
| JP | 7308011 A | 11/1995 |
| JP | 7318761 A | 12/1995 |
| JP | 8007308 A | 1/1996 |
| JP | 8248235 A | 9/1996 |
| JP | 8248237 A | 9/1996 |
| JP | 3487946 A | 10/1996 |
| JP | 8254620 A | 10/1996 |
| JP | 3279474 A | 10/1997 |
| JP | 9258033 A | 10/1997 |
| JP | 9258055 A | 10/1997 |
| JP | 2771870 B2 | 7/1998 |
| JP | 3448448 A | 8/1998 |
| JP | 10227919 A | 8/1998 |
| JP | 3478944 A | 12/1998 |
| JP | 10332945 A | 12/1998 |
| JP | 10339817 A | 12/1998 |
| JP | 11023858 A | 1/1999 |
| JP | 2000098138 A | 4/2000 |
| JP | 2000098139 A | 4/2000 |
| JP | 2000241631 A | 9/2000 |
| JP | 2001004849 A | 1/2001 |
| JP | 3160322 B2 | 4/2001 |
| JP | 2001133636 A | 5/2001 |
| JP | 3173962 B2 | 6/2001 |
| JP | 3176906 B2 | 6/2001 |
| JP | 2001154030 A | 6/2001 |
| JP | 2001159714 A | 6/2001 |
| JP | 2002022974 A | 1/2002 |
| JP | 2002077236 A | 3/2002 |
| JP | 2002116337 A | 4/2002 |
| JP | 2002169035 A | 6/2002 |
| JP | 3312893 B2 | 8/2002 |
| JP | 2002305389 A | 10/2002 |
| JP | 3344701 B2 | 11/2002 |
| JP | 2003029054 A | 1/2003 |
| JP | 3403573 B2 | 5/2003 |
| JP | 2003169026 A | 6/2003 |
| JP | 2003215353 A | 7/2003 |
| JP | 2003344701 A | 12/2003 |
| JP | 3516765 B2 | 4/2004 |
| JP | 2004144808 A | 5/2004 |
| JP | 2004514931 A | 5/2004 |
| JP | 3542939 B2 | 7/2004 |
| JP | 2004246147 A | 9/2004 |
| JP | 2004361652 A | 12/2004 |
| JP | 2004361893 A | 12/2004 |
| JP | 3107704 U | 2/2005 |
| JP | 2005055748 A | 3/2005 |
| JP | 2005062569 A | 3/2005 |
| JP | 2005084241 A | 3/2005 |
| JP | 2005148327 A | 6/2005 |
| JP | 2005257937 A | 9/2005 |
| JP | 3763645 B2 | 4/2006 |
| JP | 3778021 B2 | 5/2006 |
| JP | 2006126513 A | 5/2006 |
| JP | 2006126516 A | 5/2006 |
| JP | 3794540 B2 | 7/2006 |
| JP | 2006227041 A1 | 8/2006 |
| JP | 3833638 B2 | 10/2006 |
| JP | 2006292924 A | 10/2006 |
| JP | 3841344 B2 | 11/2006 |
| JP | 3847533 B2 | 11/2006 |
| JP | 200747336 A | 2/2007 |
| JP | 3896035 B2 | 3/2007 |
| JP | 2007067458 A1 | 3/2007 |
| JP | 3934052 B2 | 6/2007 |
| JP | 3964191 B2 | 8/2007 |
| JP | 3989853 B2 | 10/2007 |
| JP | 4026244 B2 | 12/2007 |
| JP | 4029494 B2 | 1/2008 |
| JP | 4065223 B2 | 3/2008 |
| JP | 4093475 B2 | 6/2008 |
| JP | 4105696 B2 | 6/2008 |
| JP | 4112437 B2 | 7/2008 |
| JP | 4118862 B2 | 7/2008 |
| JP | 2008176118 A1 | 7/2008 |
| JP | 2008180817 A1 | 8/2008 |
| JP | 4184329 B2 | 11/2008 |
| JP | 2008271017 A | 11/2008 |
| JP | 2008542822 T | 11/2008 |
| JP | 2009503582 T | 1/2009 |
| JP | 2009229506 A | 10/2009 |
| JP | 2012065019 A | 3/2012 |
| KR | 20110037404 A | 4/2011 |
| WO | 9105281 A1 | 4/1991 |
| WO | 9326070 A1 | 12/1993 |
| WO | 9520175 A1 | 7/1995 |
| WO | 9636896 A1 | 11/1996 |
| WO | 9638752 A1 | 12/1996 |
| WO | 9712268 A1 | 4/1997 |
| WO | 9722025 A1 | 6/1997 |
| WO | 9736197 A1 | 10/1997 |
| WO | 9744605 A1 | 11/1997 |
| WO | 9825416 A1 | 6/1998 |
| WO | 9927404 A1 | 6/1999 |
| WO | 0005611 A2 | 2/2000 |
| WO | 0127660 A2 | 4/2001 |
| WO | 0130007 A2 | 4/2001 |
| WO | 0180596 A1 | 10/2001 |
| WO | 0242818 A1 | 5/2002 |
| WO | 03009527 A2 | 1/2003 |
| WO | 03014943 A1 | 2/2003 |
| WO | 2004052066 A1 | 6/2004 |
| WO | 2005020400 A1 | 3/2005 |
| WO | 2006076062 A | 7/2006 |
| WO | 2006108024 A1 | 10/2006 |
| WO | 2007050515 A1 | 5/2007 |

(56) References Cited

FOREIGN PATENT DOCUMENTS

| WO | 2007079074 A2 | 7/2007 |
|---|---|---|
| WO | 2007089682 A2 | 8/2007 |
| WO | 2007149215 A2 | 12/2007 |
| WO | 2008027201 A2 | 3/2008 |
| WO | 2008063054 A2 | 5/2008 |
| WO | 2008113054 A2 | 9/2008 |
| WO | 2008157248 A1 | 12/2008 |
| WO | 2009026688 A1 | 3/2009 |
| WO | 2009029485 A1 | 3/2009 |
| WO | 2009030360 A1 | 3/2009 |
| WO | 2009120280 A2 | 10/2009 |
| WO | 2010024847 A2 | 3/2010 |
| WO | 2010080745 A1 | 7/2010 |
| WO | 2011005461 A1 | 1/2011 |

OTHER PUBLICATIONS

Annex to Form PCT/ISA/206, Communication Relating to the Results of the Partial International Search, for PCT/US2009/004548 mailed Jan. 19, 2010, 2 pages.
Corning Cable Systems, "Corning Cable Systems Products for BellSouth High Density Shelves," Jun. 2000, 2 pages.
Corning Cable Systems, "Corning Cable Systems Quick Reference Guide for Verizon FTTP FDH Products," Jun. 2005, 4 pages.
Conner, M. "Passive Optical Design for RFOG and Beyond," Braodband Properties, Apr. 2009, pp. 78-81.
Corning Evolant, "Eclipse Hardware Family," Nov. 2009, 1 page.
Corning Evolant, "Enhanced Management Frame," Dec. 2009, 1 page.
Corning Evolant, "Enhanced Management Frame (EMF)," Specification Sheet, Nov. 2009, 24 pages.
Corning Cable Systems, "Evolant Solutions for Evolving Networks: Fiber Optic Hardware," Oct. 2002, 2 pages.
Corning Cable Systems, "Fiber Optic Hardware with Factory-Installed Pigtails: Features and Benefits," Nov. 2010, 12 pages.
Corning Cable Systems, "FiberManager System 1- and 3-Position Compact Shelves," Jan. 2003, 4 pages.
Corning Cable Systems, "FiberManager System Frame and Components," Jan. 2003, 12 pages.
Corning Cable Systems, "High Density Frame," Jul. 2001, 2 pages.
Corning Cable Systems, "High Density Frame (HDF) Connector-Splice Shelves and Housings," May 2003, 4 pages.
International Search Report for PCT/US10/35529 mailed Jul. 23, 2010, 2 pages.
International Search Report for PCT/US10/35563 mailed Jul. 23, 2012, 1 page.
International Search Report for PCT/US2008/002514 mailed Aug. 8, 2008, 2 pages.
International Search Report for PCT/US2008/010317 mailed Mar. 4, 2008, 2 pages.
International Search Report for PCT/US2009/001692 mailed Nov. 24, 2009, 5 pages.
International Search Report for PCT/US2010/024888 mailed Jun. 23, 2010, 5 pages.
International Search Report for PCT/US2010/027402 mailed Jun. 16, 2010, 2 pages.
Corning Cable Systems, "MTX Frames and Accessories," Feb. 2006, 4 pages.
Panduit, "Lock-in LC Duplex Clip," Accessed Mar. 22, 2012, 1 page.
International Search Report for PCT/US06/49351 mailed Apr. 25, 2008, 1 page.
International Search Report for PCT/US09/57069 mailed Mar. 24, 2010, 2 pages.
International Search Report for PCT/US2009/057244 mailed Nov. 9, 2009 3 pages.
International Search Report for PCTUS2009004548 mailed Mar. 19, 2010, 5 pages.
International Search Report for PCTUS2009004549 mailed Apr. 20, 2010, 6 pages.

Siecor, "Single Shelf HDF with Slack Storage and Heat Shield (HH1-CSH-1238-1V-BS)," Jan. 1998, 12 pages.
Corning Cable Systems, "Mass Termination Xchange (MTX) Frame System Equipment Office Planning and Application Guide," SRP003-664, Issue 1, Mar. 2005, 57 pages.
Corning Cable Systems, "Mass Termination Xchange (MTX) Equipment Patch Cord Interbay Vertical Channel," SRP003-684, Issue 1, Mar. 2005, 8 pages.
Corning Cable Systems, "High Density Frame (HDF) Installation," SRP003-355, Issue 4, Sep. 2002, 18 pages.
Written Opinion for PCT/US2010/023901 mailed Aug. 25, 2011, 8 pages.
Advisory Action for U.S. Appl. No. 12/221,117 mailed Aug. 24, 2011, 3 pages.
Examiner's Answer to Appeal Brief for U.S. Appl. No. 12/221,117 mailed Mar. 29, 2012, 16 pages.
Final Office Action for U.S. Appl. No. 12/221,117 mailed Feb. 19, 2010, 7 pages.
Final Office Action for U.S. Appl. No. 12/221,117 mailed Jun. 10, 2011, 8 pages.
Non-final Office Action for U.S. Appl. No. 12/221,117 mailed Jul. 14, 2010, 7 pages.
Non-final Office Action for U.S. Appl. No. 12/221,117 mailed Jun. 9, 2009, 5 pages.
Non-final Office Action for U.S. Appl. No. 12/221,117 mailed Dec. 21, 2010, 7 pages.
Advisory Action for U.S. Appl. No. 12/394,483 mailed Feb. 16, 2012, 3 pages.
Final Office Action for U.S. Appl. No. 12/394,483 mailed Dec. 6, 2011, 14 pages.
Non-final Office Action for U.S. Appl. No. 12/394,483 mailed Jun. 17, 2011, 11 pages.
Advisory Action for U.S. Appl. No. 12/950,234 mailed Dec. 21, 2011, 3 pages.
Non-final Office Action for U.S. Appl. No. 12/950,234 mailed Jun. 17, 2011, 7 pages.
Non-final Office Action for U.S. Appl. No. 12/950,234 mailed Mar. 12, 2012, 10 pages.
Final Office Action for U.S. Appl. No. 12/950,234 mailed Oct. 14, 2011, 10 pages.
Advisory Action mailed May 12, 2011, for U.S. Appl. No. 12/323,423, 3 pages.
Final Rejection mailed Mar. 3, 2011, for U.S. Appl. No. 12/323,423, 17 pages.
Non-Final Rejection mailed Aug. 5, 2011, for U.S. Appl. No. 12/323,423, 13 pages.
Unknown, Author, "QuickNet SFQ Series MTP Fiber Optic Cassettes," Panduit Specification Sheet, Jan. 2009, 2 pages.
Unknown Author, "Cellular Specialties introduces the first simulated in-building location-based tracking solution," smart-grid.tmenet.com/news, Sep. 14, 2009, 2 pages.
Unknown Author, "CDMA Co-Pilot Transmitter," Cellular Specialties, Inc., Aug. 2009, 2 pages.
International Search Report for PCT/US2010/038986 mailed Aug. 18, 2010, 1 page.
Notice of Allowance for U.S. Appl. No. 12/871,052 mailed Sep. 18, 2013, 9 pages.
Non-final Office Action for U.S. Appl. No. 12/953,039 mailed Sep. 12, 2013, 8 pages.
Non-final Office Action for U.S. Appl. No. 12/946,139 mailed Oct. 2, 2013, 18 pages.
Final Office Action for U.S. Appl. No. 12/394,114 mailed Oct. 4, 2013, 10 pages.
Non-final Office Action for U.S. Appl. No. 12/818,986 mailed Oct. 4, 2013, 19 pages.
Non-final Office Action for U.S. Appl. No. 13/901,074 mailed Oct. 9, 2013, 6 pages.
Advisory Action for U.S. Appl. No. 12/953,134 mailed Nov. 4, 2013, 3 pages.
Final Office Action for U.S. Appl. No. 12/952,960 mailed Oct. 29, 2013, 8 pages.
Notice of Allowance for U.S. Appl. No. 13/292,130 mailed Oct. 18, 2013, 9 pages.

(56) References Cited

OTHER PUBLICATIONS

International Search Report and Written Opinion for PCT/US2011/035683 mailed Sep. 8, 2011, 15 pages.
International Search Report and Written Opinion for PCT/US2010/039218 mailed Oct. 27, 2010, 13 pages.
First Office Action for Chinese patent application 201080032453.2 issued Mar. 26, 2013, 6 pages.
Chinese Search Report for Chinese patent application 201080032453.2 mailed May 15, 2013, 2 pages.
First Office Action for Chinese patent application 201080031621.6 mailed Sep. 26, 2013, 9 pages.
Chinese Search Report for Chinese patent application 201080031621.6 mailed Sep. 13, 2013, 2 pages.
Ramdas, "Modern File Systems and Storage," Proceedings of the 2nd International SANE Conference, May 22-25, 2000, MECC, Maastricht, The Netherlands, Copyright Rodney R. Ramdas, 10 pages.
International Search Report and Written Opinion for PCT/US2011/035684 mailed Jul. 1, 2011, 11 pages.
International Search Report and Written Opinion for PCT/US11/61754 mailed Mar. 26, 2012, 9 pages.
Author Unknown, "144 Fiber Patch Panel 1U," Technical Data, ADTEK Group Limited, 2009, 2 pages.
Advisory Action for U.S. Appl. No. 12/394,114 mailed Jan. 2, 2014, 3 pages.
Notice of Allowance for U.S. Appl. No. 12/871,052 mailed Dec. 24, 2013, 9 pages.
Final Office Action for U.S. Appl. No. 12/953,039 mailed Dec. 27, 2013, 10 pages.
Advisory Action for U.S. Appl. No. 12/952,960 mailed Jan. 8, 2014, 3 pages.
Advisory Action for U.S. Appl. No. 12/952,912 mailed Nov. 26, 2013, 3 pages.
Examiner's Answer to the Appeal Brief for U.S. Appl. No. 12/953,118 mailed Dec. 3, 2013, 6 pages.
Non-final Office Action for U.S. Appl. No. 13/597,549 mailed Jan. 14, 2014, 9 pages.
Final Office Action for U.S. Appl. No. 12/732,487 mailed Dec. 6, 2013, 24 pages.
Final Office Action for U.S. Appl. No. 12/956,446 mailed Dec. 23, 2013, 12 pages.
Non-final Office Action for U.S. Appl. No. 12/953,536 mailed Dec. 17, 2013, 21 pages.
Non-final Office Action for U.S. Appl. No. 12/819,065 mailed Dec. 3, 2013, 8 pages.
International Search Report and Written Opinion for PCT/US2011/062353 mailed Apr. 10, 2012, 15 pages.
International Search Report for PCT/US2013/041268 mailed Aug. 20, 2013, 5 pages.
Notice of Allowance for U.S. Appl. No. 13/292,130 mailed Feb. 14, 2014, 7 pages.
Final Office Action for U.S. Appl. No. 12/707,889 mailed Feb. 11, 2014, 17 pages.
Non-final Office Action for U.S. Appl. No. 12/940,699 mailed Feb. 3, 2014, 10 pages.
Notice of Allowance for U.S. Appl. No. 12/952,960 mailed Feb. 13, 2014, 7 pages.
Notice of Allowance and Applicant-Initiated Interview Summary for U.S. Appl. No. 12/771,473 mailed Feb. 27, 2014, 8 pages.
Non-final Office Action for U.S. Appl. No. 13/081,856 mailed Nov. 26, 2013, 11 pages.
Non-final Office Action for U.S. Appl. No. 13/663,975 mailed Jan. 31, 2014, 18 pages.
Non-final Office Action for U.S. Appl. No. 12/394,114 mailed Mar. 21, 2014, 9 pages.
Final Office Action for U.S. Appl. No. 12/940,585 mailed Mar. 18, 2014, 15 pages.
Non-final Office Action for U.S. Appl. No. 12/953,101 mailed Apr. 3, 2014, 9 pages.

Advisory Action for U.S Appl. No. 12/953,039 mailed Mar. 6, 2014, 3 pages.
Advisory Action for U.S. Appl. No. 12/956,446 mailed Mar. 20, 2014, 3 pages.
Final Office Action for U.S. Appl. No. 13/603,894 mailed Mar. 20, 2014, 15 pages.
International Search Report for PCT/US2012/023622 mailed Mar. 9, 2012, 4 pages.
International Search Report for PCT/US2012/023635 mailed Sep. 14, 2012, 3 pages.
International Search Report for PCT/US2012/023626 mailed May 22, 2012, 4 pages.
Notice of Allowance for U.S. Appl. No. 13/951,916 mailed Dec. 16, 2013, 12 pages.
International Preliminary Report on Patentability for PCT/US2012/052958 mailed Mar. 13, 2014, 14 pages.
Non-final Office Action for U.S. Appl. No. 12/947,883 mailed Sep. 6, 2013, 9 pages.
Final Office Action for U.S. Appl. No. 12/947,883 mailed Mar. 31, 2014, 13 pages.
International Search Report for PCT/US2011/030446 mailed Jul. 14, 2011, 2 pages.
International Search Report for PCT/US2011/030448 mailed Jul. 20, 2011, 2 pages.
International Search Report for PCT/US2011/030466 mailed Aug. 5, 2011, 2 pages.
International Search Report for PCT/US2012/052958 mailed Mar. 1, 2013, 7 pages.
International Search Report for PCT/US2013/041266 mailed Aug. 20, 2013, 4 pages.
Non-final Office Action for U.S. Appl. No. 13/621,958 mailed Feb. 13, 2014, 10 pages.
Non-final Office Action for U.S. Appl. No. 13/649,417 mailed Feb. 13, 2014, 10 pages.
Non-final Office Action for U.S. Appl. No. 13/663,949 mailed Feb. 3, 2014, 19 pages.
Non-final Office Action for U.S. Appl. No. 12/953,003 mailed Apr. 14, 2014, 13 pages.
Non-final Office Action for U.S. Appl. No. 12/953,039 mailed Apr. 15, 2014, 8 pages.
Final Office Action for U.S. Appl. No. 12/946,139 mailed Apr. 22, 2014, 18 pages.
Final Office Action for U.S. Appl. No. 13/597,549 mailed Apr. 24, 2014, 10 pages.
Final Office Action for U.S. Appl. No. 13/901,074 mailed May 9, 2014, 7 pages.
International Search Report for PCT/US2010/023901 mailed Jun. 11, 2010, 3 pages.
Notice of Allowance for U.S. Appl. No. 12/576,769 mailed May 31, 2012, 9 pages.
Non-final Office Action for U.S. Appl. No. 12/576,806 mailed Dec. 13, 2011, 6 pages.
Notice of Allowance for U.S. Appl. No. 12/576,806 mailed Apr. 18, 2012, 5 pages.
International Search Report for PCT/US2009/066779 mailed Aug. 27, 2010, 3 pages.
"MPO Fiber Optic Rack Panels now available from L-com Connectivity Products," article dated Jun. 4, 2007, 16 pages, http://www.I-com.com/content/Article.aspx?Type=P&ID=438.
"19" Rack Panel with 16 MPO Fiber Optic Couplers—1U high," product page, accessed Oct. 23, 2012, 2 pages, http://www.I-com.com/item.aspx?id=9767#.UlbgG8XXay5.
"Drawing for L-com 1U Panel with 16 MTP couplers," May 15, 2007, 1 page, http://www.I-com.com/multimedia/eng_drawings/PR17516MTP.pdf.
Non-final Office Action for U.S. Appl. No. 12/771,473 mailed Oct. 4, 2012, 6 pages.
Non-final Office Action for U.S. Appl. No. 12/819,081 mailed Aug. 21, 2012, 12 pages.
Notice of Allowance for U.S. Appl. No. 12/417,325 mailed Aug. 22, 2012, 7 pages.
Notice of Panel Decision for Pre-Appeal Brief for U.S. Appl. No. 12/417,325 mailed Aug. 8, 2012, 2 pages.

(56) References Cited

OTHER PUBLICATIONS

Advisory Action for U.S. Appl. No. 12/417,325 mailed Jun. 29, 2012, 3 pages.
Advisory Action for U.S. Appl. No. 12/417,325 mailed Jun. 12, 2012, 3 pages.
Final Office Action for U.S. Appl. No. 12/417,325 mailed Apr. 16, 2012, 6 pages.
Final Office Action for U.S. Appl. No. 12/417,325 mailed Feb. 7, 2012, 7 pages.
Non-final Office Action for U.S. Appl. No. 12/417,325 mailed Jun. 15, 2011, 6 pages.
Notice of Allowance for U.S. Appl. No. 12/487,929 mailed Sep. 12, 2012, 4 pages.
Notice of Allowance for U.S. Appl. No. 12/487,929 mailed Jun. 13, 2012, 8 pages.
Advisory Action for U.S. Appl. No. 12/487,929 mailed Apr. 17, 2012, 3 pages.
Final Office Action for U.S. Appl. No. 12/487,929 mailed Feb. 14, 2012, 6 pages.
Final Office Action for U.S. Appl. No. 12/487,929 mailed Dec. 5, 2011, 7 pages.
Non-final Office Action for U.S. Appl. No. 12/487,929 mailed May 23, 2011, 7 pages.
Notice of Allowance for U.S. Appl. No. 12/415,253 mailed Mar. 11, 2011, 7 pages.
Non-final Office Action for U.S. Appl. No. 12/415,253 mailed Jul. 12, 2010, 11 pages.
Final Office Action for U.S. Appl. No. 12/415,253 mailed Apr. 16, 2010, 9 pages.
Non-final Office Action for U.S. Appl. No. 12/415,253 mailed Sep. 30, 2009, 8 pages.
Non-final Office Action for U.S. Appl. No. 12/641,617 mailed Oct. 5, 2012, 21 pages.
Final Office Action for U.S. Appl. No. 12/630,938 mailed Jun. 1, 2012, 18 pages.
Non-final Office Action for U.S. Appl. No. 12/630,938 mailed Dec. 19, 2011, 15 pages.
Non-final Office Action for U.S. Appl. No. 12/751,884 mailed Jul. 2, 2012, 9 pages.
Non-final Office Action for U.S. Appl. No. 12/871,052 mailed Aug. 13, 2012, 8 pages.
Final Office Action for U.S. Appl. No. 12/394,114 mailed Oct. 25, 2012, 8 pages.
Non-final Office Action for U.S. Appl. No. 12/915,682 mailed Oct. 24, 2012, 8 pages.
Non-final Office Action for U.S. Appl. No. 12/818,986 mailed Feb. 3, 2012, 12 pages.
Final Office Action for U.S. Appl. No. 12/818,986 mailed Oct. 18, 2012, 13 pages.
Non-final Office Action for U.S. Appl. No. 12/952,960 mailed Oct. 4, 2012, 11 pages.
Non-final Office Action for U.S. Appl. No. 12/953,134 mailed Sep. 25, 2012, 8 pages.
Non-final Office Action for U.S. Appl. No. 12/953,039 mailed Jan. 11, 2013, 6 pages.
Non-final Office Action for U.S. Appl. No. 12/952,912 mailed Dec. 28, 2012, 9 pages.
Non-final Office Action for U.S. Appl. No. 12/953,118 mailed Jan. 7, 2013, 9 pages.
Non-final Office Action for U.S. Appl. No. 12/953,536 mailed Jan. 2, 2013, 20 pages.
Non-final Office Action for U.S. Appl. No. 12/707,889 mailed Jan. 2, 2013, 7 pages.
European Search Report for patent application 10790017.7 mailed Nov. 8, 2012, 7 pages.
Examination Report for European patent application 09789090.9-2216 mailed Aug. 29, 2011, 4 pages.
Examination Report for European patent application 09789090.9-2216 mailed Mar. 30, 2012, 6 pages.
Written Opinion of the International Searching Authority for International patent application PCT/US2009004548, mailed Apr. 5, 2011, 6 pages.
European Search Report for European patent application 09789090.9-2217 mailed Jan. 24, 2013, 5 pages.
Non-final Office Action for U.S. Appl. No. 12/946,139 mailed Jul. 26, 2012, 12 pages.
Final Office Action for U.S. Appl. No. 12/946,139 mailed Feb. 15, 2013, 17 pages.
Non-final Office Action for U.S. Appl. No. 12/751,884 mailed Feb. 15, 2013, 5 pages.
Non-final Office Action for U.S. Appl. No. 12/394,114 mailed Feb. 27, 2013, 8 pages.
Non-final Office Action for U.S. Appl. No. 12/819,065 mailed Mar. 4, 2013, 7 pages.
Final Office Action for U.S. Appl. No. 12/952,960 mailed Mar. 7, 2013, 13 pages.
Notice of Allowance for U.S. Appl. No. 12/732,487 mailed Mar. 19, 2013, 11 pages.
Non-final Office Action for U.S. Appl. No. 12/953,134 mailed Mar. 21, 2013, 9 pages.
Final Office Action for U.S. Appl. No. 12/641,617 mailed May 10, 2013, 21 pages.
Notice of Allowance for U.S. Appl. No. 13/090,621 mailed Apr. 22, 2013, 8 pages.
Final Office Action for U.S. Appl. No. 12/953,039 mailed May 1, 2013, 8 pages.
Final Office Action for U.S. Appl. No. 12/953,118 mailed May 3, 2013, 11 pages.
Final Office Action for U.S. Appl. No. 12/915,682 mailed Apr. 18, 2013, 9 pages.
Advisory Action for U.S. Appl. No. 12/952,960 mailed May 15, 2013, 2 pages.
Non-final Office Action for U.S. Appl. No. 12/952,960 mailed Jun. 20, 2013, 13 pages.
Non-final Office Action for U.S. Appl. No. 12/953,536 mailed Jun. 6, 2013, 21 pages.
Non-final Office Action for U.S. Appl. No. 11/820,300 mailed Apr. 25, 2012, 10 pages.
Final Office Action for U.S. Appl. No. 12/871,052 mailed Jul. 1, 2013, 12 pages.
Non-final Office Action for U.S. Appl. No. 12/940,699 mailed Jun. 26, 2013, 9 pages.
Notice of Allowance for U.S. Appl. No. 13/090,621 mailed Jun. 25, 2013, 8 pages.
Non-final Office Action for U.S. Appl. No. 12/956,475 mailed Oct. 4, 2012, 7 pages.
Non-final Office Action for U.S. Appl. No. 13/302,067 mailed Jun. 7, 2013, 13 pages.
Final Office Action for U.S. Appl. No. 12/771,473 mailed Jul. 19, 2013, 7 pages.
Notice of Allowance for U.S. Appl. No. 12/751,884 mailed Jul. 17, 2013, 8 pages.
Non-final Office Action for U.S. Appl. No. 12/940,585 mailed Aug. 16, 2013, 14 pages.
Final Office Action for U.S. Appl. No. 12/953,134 mailed Aug. 23, 2013, 11 pages.
*Ex parte Quayle* Action for U.S. Appl. No. 12/953,164 mailed Aug. 16, 2013, 5 pages.
Non-final Office Action for U.S. Appl. No. 12/732,487 mailed Jul. 17, 2013, 22 pages.
Advisory Action for U.S. Appl. No. 12/953,039 mailed Jul. 12, 2013, 3 pages.
Advisory Action for U.S. Appl. No. 12/953,118 mailed Jul. 12, 2013, 3 pages.
Advisory Action for U.S. Appl. No. 12/641,617 mailed Jul. 29, 2013, 3 pages.
Final Office Action for U.S. Appl. No. 12/952,912 mailed Aug. 30, 2013, 15 pages.
Advisory Action for U.S. Appl. No. 12/771,473 mailed Oct. 2, 2013, 3 pages.
Notice of Allowance for U.S. Appl. No. 12/641,617 mailed Sep. 4, 2013, 9 pages.

(56) References Cited

OTHER PUBLICATIONS

Non-Final Rejection mailed Sep. 7, 2010, for U.S. Appl. No. 12/323,423, 18 pages.
Notice of Allowance for U.S. Appl. No. 12/323,423 mailed Jan. 24, 2012, 8 pages.
Examiner's Answer mailed Mar. 4, 2011, for U.S. Appl. No. 12/323,415, 11 pages.
Final Rejection mailed Jun. 25, 2010, for U.S. Appl. No. 12/323,415, 10 pages.
Non-Final Rejection mailed Aug. 5, 2011, for U.S. Appl. No. 12/323,415, 41 pages.
Non-final Office Action for U.S. Appl. No. 12/323,415 mailed Apr. 23, 2012, 11 pages.
Non-Final Rejection mailed Dec. 10, 2009, for U.S. Appl. No. 12/323,415, 7 pages.
Examiner's Answer to Appeal Brief for U.S. Appl. No. 11/320,062 mailed Dec. 8, 2011, 8 pages.
Final Office Action for U.S. Appl. No. 11/320,062 mailed Mar. 8, 2011, 8 pages.
Non-final Office Action for U.S. Appl. No. 11/320,062 mailed Jan. 15, 2010, 11 pages.
Non-final Office Action for U.S. Appl. No. 12/320,062 mailed Sep. 30, 2010, 7 pages.
Final Office Action for U.S. Appl. No. 11/439,086 mailed Feb. 4, 2010, 14 pages.
Non-final Office Action for U.S. Appl. No. 11/439,086 mailed May 3, 2010, 11 pages.
Non-final Office Action for U.S. Appl. No. 11/439,086 mailed Sep. 21, 2009, 10 pages.
Final Office Action for U.S. Appl. No. 12/079,481 mailed Mar. 18, 2010, 10 pages.
Non-final Office Action for U.S. Appl. No. 12/079,481 mailed Dec. 26, 2008, 9 pages.
Non-final Office Action for U.S. Appl. No. 12/079,481 mailed Sep. 16, 2009, 10 pages.
Notice of Allowance for U.S. Appl. No. 12/079,481 mailed Jun. 3, 2010, 6 pages.
Notice of Allowance for U.S. Appl. No. 12/079,481 mailed Oct. 4, 2010, 4 pages.
Final Office Action for U.S. Appl. No. 12/394,114 mailed Dec. 22, 2011, 8 pages.
Non-final Office Action for U.S. Appl. No. 12/394,114 mailed Mar. 16, 2012, 8 pages.
Non-final Office Action for U.S. Appl. No. 12/394,114 mailed Sep. 1, 2011, 7 pages.
Non-final Office Action for U.S. Appl. No. 12/323,373 mailed May 3, 2012, 7 pages.
Non-final Office Action for U.S. Appl. No. 11/809,474 mailed Apr. 8, 2008, 13 pages.
Non-final Office Action for U.S. Appl. No. 11/809,474 mailed Nov. 13, 2008, 10 pages.
Notice of Allowance for U.S. Appl. No. 11/809,474 mailed Jul. 6, 2009, 6 pages.
Final Office Action for U.S. Appl. No. 11/320,031 mailed Mar. 8, 2011, 8 pages.
Non-final Office Action for U.S. Appl. No. 11/320,031 mailed Jan. 5, 2010, 16 pages.
Non-final Office Action for U.S. Appl. No. 11/320,031 mailed Sep. 30, 2010, 7 pages.
Notice of Allowance for U.S. Appl. No. 11/320,031 mailed Nov. 15, 2011, 7 pages.
Non-final Office Action for U.S. Appl. No. 12/157,622 mailed Mar. 31, 2009, 9 pages.
Non-final Office Action for U.S. Appl. No. 12/157,622 mailed Oct. 15, 2009, 9 pages.
Notice of Allowance for U.S. Appl. No. 12/157,622 mailed Apr. 22, 2010, 4 pages.
Non-final Office Action for U.S. Appl. No. 12/323,395 mailed Dec. 8, 2011, 7 pages.
Non-final Office Action for U.S. Appl. No. 12/415,454 mailed Mar. 2, 2012, 5 pages.
Non-final Office Action for U.S. Appl. No. 12/415,454 mailed Sep. 6, 2011, 7 pages.
Notice of Allowance for U.S. Appl. No. 12/415,454 mailed Jan. 13, 2012, 5 pages.
Non-final Office Action for U.S. Appl. No. 12/576,769 mailed Feb. 2, 2012, 23 pages.
Notice of Allowance for U.S. Appl. No. 12/415,454 mailed Jun. 19, 2012, 5 pages.
Non-final Office Action for U.S. Appl. No. 13/603,894 mailed Oct. 3, 2013, 9 pages.
Final Office Action for U.S. Appl. No. 12/953,039 mailed Jul. 25, 2014, 10 pages.
Advisory Action for U.S. Appl. No. 12/953,039 mailed Oct. 3, 2014, 3 pages.
Notice of Allowance for U.S. Appl. No. 12/953,536 mailed Aug. 28, 2014, 9 pages.
Final Office Action for U.S. Appl. No. 13/901,074 mailed Sep. 5, 2014, 7 pages.
Final Office Action for U.S. Appl. No. 13/663,975 mailed Aug. 14, 2014, 42 pages.
Corrected Notice of Allowance for U.S. Appl. No. 13/533,093 mailed Sep. 2, 2014, 7 pages.
Notice of Allowance for U.S. Appl. No. 13/649,417 mailed Sep. 8, 2014, 7 pages.
Examiner's Answer to the Appeal for U.S. Appl. No. 12/952,912 mailed Sep. 11, 2014, 15 pages.
Advisory Action and Examiner-Initiated Interview Summary for U.S. Appl. No. 13/081,856 mailed Sep. 16, 2014, 4 pages.
Notice of Allowance for U.S. Appl. No. 13/455,646 mailed Sep. 26, 2014, 9 pages.
Non-Final Office Action for U.S. Appl. No. 13/663,949 mailed Sep. 25, 2014, 21 pages.
Notice of Allowance for U.S. Appl. No. 13/597,549 mailed Oct. 3, 2014, 8 pages.
Decision on Appeal for U.S. Appl. No. 11/320,062 mailed Aug. 14, 2014, 8 pages.
Final Office Action for U.S. Appl. No. 12/953,101 mailed Oct. 20, 2014, 14 pages.
Notice of Allowance for U.S. Appl. No. 13/533,093 mailed Oct. 17, 2014, 9 pages.
Notice of Allowance for U.S. Appl. No. 12/732,487 mailed Oct. 7, 2014, 8 pages.
Non-Final Office Action for U.S. Appl. No. 13/567,288 mailed Oct. 8, 2014, 7 pages.
Advisory Action for U.S. Appl. No. 12/818,986 mailed Oct. 15, 2014, 5 pages.
Examiner's Answer to the Appeal Brief for U.S. Appl. No. 12/953,134 mailed Aug. 1, 2014, 7 pages.
Author Unknown, "Hubbell OptiChannel High Density 144 Port 1U Fiber Enclosure," Brochure, Date Unknown, 2 pages, http://www.hubbell-premise.com/literature/PLDF010.pdf.
Non-final Office Action for U.S. Appl. No. 12/956,446 mailed Dec. 5, 2014, 12 pages.
Advisory Action for U.S. Appl. No. 13/663,975 mailed Dec. 24, 2014, 7 pages.
Final Office Action for U.S. Appl. No. 12/394,114 mailed Oct. 31, 2014, 10 pages.
Non-final Office Action for U.S. Appl. No. 12/940,699 mailed Oct. 28, 2014, 9 pages.
Non-final Office Action for U.S. Appl. No. 12/953,039 mailed Nov. 12, 2014, 8 pages.
Notice of Allowance for U.S. Appl. No. 12/952,960 mailed Nov. 10, 2014, 7 pages.
Notice of Allowance for U.S. Appl. No. 13/081,856 mailed Oct. 29, 2014, 10 pages.
Notice of Allowance for U.S. Appl. No. 13/833,876 mailed Nov. 7, 2014, 7 pages.
Advisory Action for U.S. Appl. No. 13/901,074 mailed Nov. 24, 2014, 3 pages.
Notice of Allowance for U.S. Appl. No. 12/751,895 mailed Nov. 19, 2014, 8 pages.

(56) References Cited

OTHER PUBLICATIONS

Non-final Office Action for U.S. Appl. No. 12/946,217 mailed Jul. 26, 2012, 25 pages.
Final Office Action for U.S. Appl. No. 12/946,217 mailed Mar. 18, 2013, 48 pages.
Non-final Office Action for U.S. Appl. No. 12/946,217 mailed Oct. 3, 2013, 47 pages.
Final Office Action for U.S. Appl. No. 12/946,217 mailed Apr. 25, 2014, 40 pages.
Non-final Office Action for U.S. Appl. No. 13/833,876 mailed Apr. 24, 2014, 7 pages.
Notice of Allowance for U.S. Appl. No. 12/953,536 mailed May 20, 2014, 9 pages.
Advisory Action for U.S. Appl. No. 12/707,889 mailed Jun. 11, 2014, 4 pages.
Advisory Action for U.S. Appl. No. 12/940,585 mailed Jun. 17, 2014, 3 pages.
Advisory Action for U.S. Appl. No. 12/947,883 mailed Jun. 19, 2014, 3 pages.
Non-final Office Action for U.S. Appl. No. 12/732,487 mailed Jun. 20, 2014, 24 pages.
Non-final Office Action for U.S. Appl. No. 13/621,958 mailed Jun. 20, 2014, 13 pages.
Final Office Action for U.S. Appl. No. 13/649,417 mailed Jun. 25, 2014, 9 pages.
Non-final Office Action for U.S. Appl. No. 12/952,960 mailed Jun. 26, 2014, 13 pages.
Non-final Office Action for U.S. Appl. No. 13/746,938 mailed Jul. 11, 2014, 9 pages.
Non-final Office Action for U.S. Appl. No. 12/751,895 mailed May 20, 2014, 9 pages.
Notice of Allowance for U.S. Appl. No. 13/533,093 mailed Jul. 8, 2014, 9 pages.
Notice of Allowance for U.S. Appl. No. 13/597,549 mailed Jul. 8, 2014, 8 pages.
Notice of Allowance for U.S. Appl. No. 13/455,646 mailed Jun. 2, 2014, 9 pages.
Non-final Office Action for U.S. Appl. No. 12/819,065 mailed Jul. 18, 2014, 10 pages.
Final Office Action for U.S. Appl. No. 12/818,986 mailed Jul. 18, 2014, 27 pages.
Final Office Action for U.S. Appl. No. 13/081,856 mailed Jul. 2, 2014, 8 pages.
Notice of Allowance for U.S. Appl. No. 12/221,117 mailed Jul. 16, 2014, 7 pages.
Decision on Appeal for U.S. Appl. No. 12/221,117 mailed Jul. 1, 2014, 7 pages.
Author Unknown, "FiberManager Frame Cross-connect Configuration Fiber Tracing Option: Installation and Maintenance," Siecor Corporation, A0402884, Release 04.00, Jul. 1995, 80 pages.
Author Unknown, "FOS-FDT", Corning Cable Systems, SRP-003-305, Issue 4, Mar. 2001, 17 pages.
Author Unknown, "Optical Management Shelf (OMS)," Corning Cable Systems, Standard Recommended Procedure (SRP) 003-600, Issue 3, Apr. 2004, 9 pages.
Author Unknown, "Single Shelf HDF Installation," Standard Recommended Procedure (SRP) 003-377, Corning Cable Systems, Issue 5, Aug. 2001, pp. 1-12.
Advisory Action for U.S. Appl. No. 12/394,114 mailed Jan. 16, 2015, 3 pages.
Notice of Allowance and Examiner-Initiated Interview Summary for U.S. Appl. No. 12/947,883 mailed Jan. 13, 2015, 11 pages.
Non-final Office Action for U.S. Appl. 12/818,986 mailed Jan. 5, 2015, 21 pages.
Notice of Allowance for U.S. Appl. No. 13/649,417 mailed Jan. 8, 2015, 7 pages.
Non-final Office Action for U.S. Appl. No. 12/946,217 mailed Dec. 29, 2014, 50 pages.
Notice of Allowance and Examiner-Initiated Interview Summary for U.S. Appl. No. 12/940,585 mailed Feb. 27, 2015, 16 pages.
Notice of Allowance for U.S. Appl. No. 12/953,101 mailed Feb. 20, 2015, 9 pages.
Final Office Action for U.S. Appl. No. 12/953,003 mailed Feb. 12, 2015, 14 pages.
Final Office Action for U.S. Appl. No. 12/953,039 mailed Feb. 23, 2015, 9 pages.
Final Office Action for U.S. Appl. No. 12/819,065 mailed Mar. 12, 2015, 13 pages.
Examiner's Answer to the Appeal Brief for U.S. Appl. No. 12/946,139 mailed Feb. 5, 2015, 12 pages.
Notice of Allowance for U.S. Appl. No. 12/707,889 mailed Feb. 17, 2015, 7 pages.
Non-final Office Action for U.S. Appl. No. 13/902,012 mailed Feb. 17, 2015, 9 pages.
Non-final Office Action for U.S. Appl. No. 13/081,856 mailed Feb. 9, 2015, 8 pages.

* cited by examiner

ADAPTER PANEL SUPPORT ASSEMBLY

CROSS-REFERENCE TO RELATED APPLICATIONS

This application claims the benefit of priority under 35 U.S.C. §119 of U.S. Provisional Application Ser. No. 61/565,015 filed on Nov. 30, 2011 the content of which is relied upon and incorporated herein by reference in its entirety.

BACKGROUND

1. Field of the Disclosure

The technology of the disclosure relates to adapter panel support assemblies and particularly to a support assembly for an adapter panel that rotates, swivels or tilts to different positions to provide access to either side of the adapter panel, and, thereby, to the front and back of the adapters.

2. Technical Background

Fiber optic terminals in a fiber optic network may be referred to as local convergence points, fiber distribution terminals, fiber distribution hubs, and the like. Such fiber optic terminals are typically cabinets or enclosures which may house fiber connection points and other fiber optic components. This enables the transmission of optical signals over optical fibers connected to the terminals and extended towards the subscriber premises in the optical networks. Thus, the fiber optic terminal provides a convergence point for the fibers and the optical signals between the network operator or service provider and the subscriber. The convergence point offers management capabilities to the network operator or service provider in the deployment and operation of telecommunication networks. Such telecommunication networks may include all-fiber access networks and/or networks involving fiber fed remote radio technology, such as fiber-to-the-antenna (FTTA). Some of the advantages of FTTA are space savings and simple system installation. The FTTA may employ a remote radio distribution terminal which combines optical and power connectivity into one terminal. It is a lightweight and compact solution where space is important.

SUMMARY

Embodiments disclosed in the detailed description include an adapter panel support assembly having a frame assembly, a mounting bracket and a connection assembly. The frame assembly is adapted to receive and support an adapter panel. The mounting bracket mounts the frame assembly to a surface. The connection assembly connects the frame assembly to the mounting bracket to allow the frame assembly to rotate and releasably lock at more than two positions when force is applied to the frame assembly. The connection assembly has a plurality of detents positioned at the mounting bracket at predetermined locations. The frame assembly releasably locks at the positions of the detents. The connection assembly has a ball bearing plunger mounted in the frame assembly. The ball bearing plunger retracts when the force is applied to the frame assembly to rotate the frame assembly between the detents and extends into each of the detents at the position of each of the detents to releasably lock the frame assembly at the position of that detent. The frame assembly has a flange adapted to allow force to be applied to the frame assembly to rotate the frame assembly.

The fiber optic apparatus also may have a stop including a forward stop and a rearward stop to limit the amount of rotation of the frame assembly in a forward direction and in a rearward direction. The mounting bracket may comprise a first mounting bracket and a second mounting bracket. The first mounting bracket may be attached to the frame assembly at a first location. The second mounting bracket may be attached to the frame assembly at a second location. At least one of the first mounting bracket and the second mounting bracket may include a stop for limiting the rotation of the frame assembly in one or both of a forward or rearward direction. The frame assembly may be adjustable to support different sized adapter panels. The frame assembly may be configured to allow the adapter panel to be releasably attached to the frame assembly and allow for access to front and back of the adapters mounted on the adapter panel. The connection assembly comprises a stud extending from the frame assembly and through the bracket.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Embodiments disclosed in the detailed description include an adapter panel support assembly having a frame assembly, a mounting bracket and a connection assembly. The frame assembly is adapted to receive and support an adapter panel. The mounting bracket mounts the frame assembly to a surface. The connection assembly connects the frame assembly to the mounting bracket to allow the frame assembly to rotate and releasably lock at more than two postions when force is applied to the frame assembly. The connection assembly has a plurality of detents positioned at the mounting bracket at predetermined locations. The frame assembly releasably locks at the positions of the detents. The connection assembly has a ball bearing plunger mounted in the frame assembly. The ball bearing plunger retracts when the force is applied to the frame assembly to rotate the frame assembly between the detents and extends into each of the detents at the position of each of the detents to releasably lock the frame assembly at the position of that detent. The frame assembly has a flange adapted to allow force to be applied to the frame assembly to rotate the frame assembly.

The fiber optic apparatus also may have stop including a forward stop and a rearward stop to limit the amount of rotation of the frame assembly in a forward direction and in a rearward direction. The mounting bracket may comprise a first mounting bracket and a second mounting bracket. The first mounting bracket may be attached to the frame assembly at a first location. The second mounting bracket may be attached to the frame assembly at a second location. At least one of the first mounting bracket and the second mounting bracket may include a stop for limiting the rotation of the frame assembly in one or both of a forward or rearward direction. The frame assembly may be adjustable to support different sized adapter panels. The frame assembly may be configured to allow the adapter panel to be releasably attached to the frame assembly and allow for access to front and back of the adapters mounted on the adapter panel. The connection assembly comprises a stud extending from the frame assembly and through the bracket.

The adapters in the adapter panel may be ones that provide for multi-fiber connector to multi-fiber connector interconnection, such as, for example, an MTP connector, or OptiTIP connector, as commercially available from Corning Cable Systems LLC of Hickory, N.C., or other types of multi-fiber adapters. Additionally or alternatively, the fiber optic adapters may be ones that provides for single fiber connector to single fiber connector interconncetion, for example an SC connector, LC connector, or OptiTAP connector, as commercially available from Corning Cable Systems LLC of Hickory, N.C., or other types of single fiber adapters.

Figure 1:
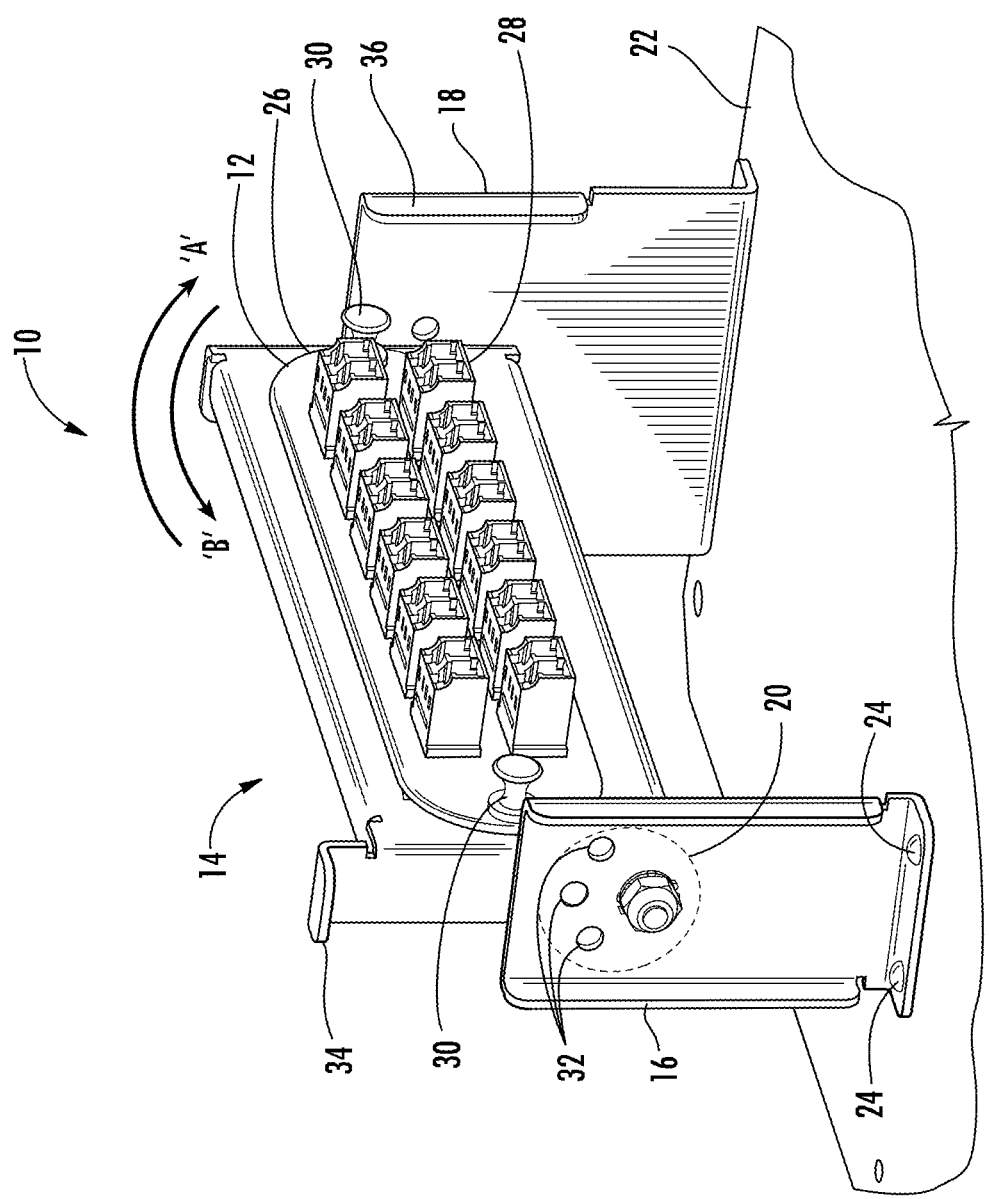
FIG. 1 is a schematic diagram of a front perspective view of an exemplary embodiment of an assembled adapter panel support assembly.

Referring now to FIG. 1 there is illustrated an exemplary embodiment of an adapter panel support assembly 10 with an adapter panel 12 removably mounted thereto. The adapter panel support assembly 10 includes a frame assembly 14, first mounting bracket 16, second mounting bracket 18 and connection assembly 20. The frame assembly 14 is adapted to receive and support the adapter panel 12. One or both of the first mounting bracket 16 and the second mounting bracket 18 mount the frame assembly 14 to a surface 22. The first mounting bracket 16 and the second mounting bracket 18 may mount the frame assembly 14 to the mounting surface 22 using any suitable fastener 24 as examples, screws, rivets, and the like. The adapter panel 12 may include a mounting plate 26 on or through which adapters 28 are mounted. Although not shown on FIG. 1, the adapters 28 may be used to receive fiber optic connectors which terminate fiber optic cables. In this way, the adapters 28 may interconnect fiber optic cables and establish optical communication between the fiber optic cables. The adapter plate 26 may mount to the frame assembly 14 in any suitable manner. In FIG. 1, the adapter plate 26 is shown removably mounted to the frame assembly 14 using push-pins 30, although any suitable fastener may be used for removably mounting the adapter panel 12 to the frame assembly 14.

In FIG. 1, the connection assembly 20 is shown connecting the frame assembly 14 to the first mounting bracket 16. A connection assembly 20 may also connect the frame assembly 14 to the second mounting bracket 18. The connection assembly 20 allows the frame assembly 14 to rotate and releasably lock at more than two positions when force is applied to the frame assembly 14. The frame assembly 14 may rotate in a forward rotational direction, indicated in FIG. 1 by a directional arrow marked 'A' or rearward rotational direction, indicated in FIG. 1 by a directional arrow marked 'B'. Additionally, the connection assembly 20 may have a plurality of detents 32 positioned at the first mounting bracket 16 at predetermined locations. The connection assembly 20 will be shown in more detail below with reference to FIG. 2. Although in FIG. 1, three detents 32 are shown, any number of detents 32 may be included. The frame assembly 14 releasably locks at the positions of the detents 32 as will be discussed in more detail with reference to FIG. 2. Although not shown in FIG. 1, the detents 32 may also be positioned in the second mounting bracket 18. The frame assembly 14 may include a flange 34 adapted to allow force to be applied to the frame assembly 14 to rotate the frame assembly 14. Also in FIG. 1, a forward stop 36 is shown extending the second mounting bracket 18. The forward stop 36 may be used to limit the rotation of the frame assembly 14 in the forward rotational direction. A rearward stop 38, not shown in FIG. 1, may be used to limit the rotation of the frame assembly 14 in the rearward rotational direction. Although in FIG. 1, the forward stop 36 is shown extending from the second mounting bracket 18, the forward stop 36 and the rearward stop 38 may extend from the first mounting bracket 16, or may otherwise be incorporated in the adapter panel support assembly 10, as non-limiting examples, in the frame assembly 14 and/or the connection assembly 20.

Figure 2:
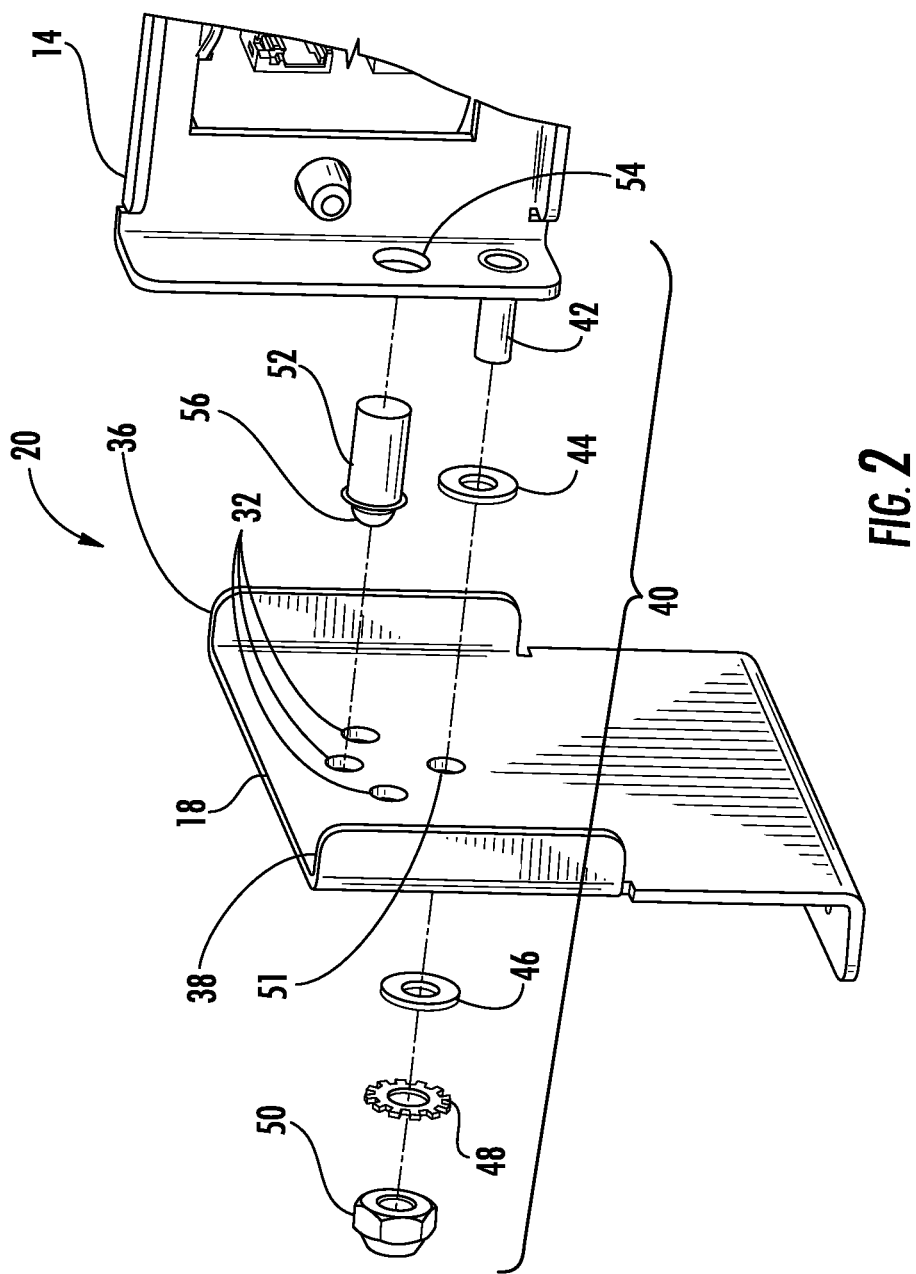
FIG. 2 is a schematic diagram of a perspective, exploded detail view of a connection assembly in the adapter panel support assembly of FIG. 1.

Referring now to FIG. 2, there is shown a detail view of the connection assembly 20. In FIG. 2, the connection assembly 20 is shown connecting the frame assembly 14 to the second mounting bracket 18. A pivot assembly 40 includes a stud 42 extending from the frame assembly 14, flat washers 44, 46 and tooth washer 48 and nylon nut 50. The flat washers 44, 46 and tooth washer 48 fit around the stud 42 and the stud inserts through pivot hole 51 which extends through the second mounting bracket 18. The nylon nut 50 attaches to the end of the stud 42 and secures the pivot assembly 40 in movably, rotationally retains the frame assembly 14 to the second mounting bracket 18. A similar pivot assembly 40 may be used movably, rotationally retain the frame assembly 14 to the first mounting bracket 16.

The connection assembly 20 may also include a ball bearing plunger 52. The ball bearing plunger 52 inserts into plunger hole 54 in the frame assembly 14 and extends to and contacts the second mounting bracket 18 at the plunger end 56 of the ball bearing plunger 52. The ball bearing plunger 52 retracts against the second mounting bracket 18 when the ball bearing plunger 52 is not positioned at a detent 32. This may occur when the force is applied to the frame assembly 14 to rotate the frame assembly 14 between the detents 32. Force may be applied to the frame assembly 14 using the flange 34. As the frame assembly 14 continues to rotate, the ball bearing plunger 52 may continue to be retracted until the frame assembly 14 rotates to a position that aligns the ball bearing plunger 52 with one of the detents 32. When the ball bearing plunger 52 aligns with one of the detents 32, the ball bearing plunger 52 extends into that detent 32. In this manner, the ball bearing plunger 52 releasably locks the frame assembly 14 at the position of that detent 32. Force applied to the frame assembly 14 while the ball bearing plunger 52 is extended into a detent 32 may cause the ball bearing plunger 52 to retract releasing the ball bearing plunger 52 from the detent 32 and allowing the frame assembly 14 to rotate. Depending on the force applied to the frame assembly 14, the frame assembly 14 may rotate in the forward rotational direction 'A' or rearward rotational direction 'B'. The frame assembly 14 will continue to rotate until the ball bearing plunger 52 aligns with another detent 32 or until the frame assembly 14 contacts the forward stop 36 or rearward stop 38.

Figure 3:
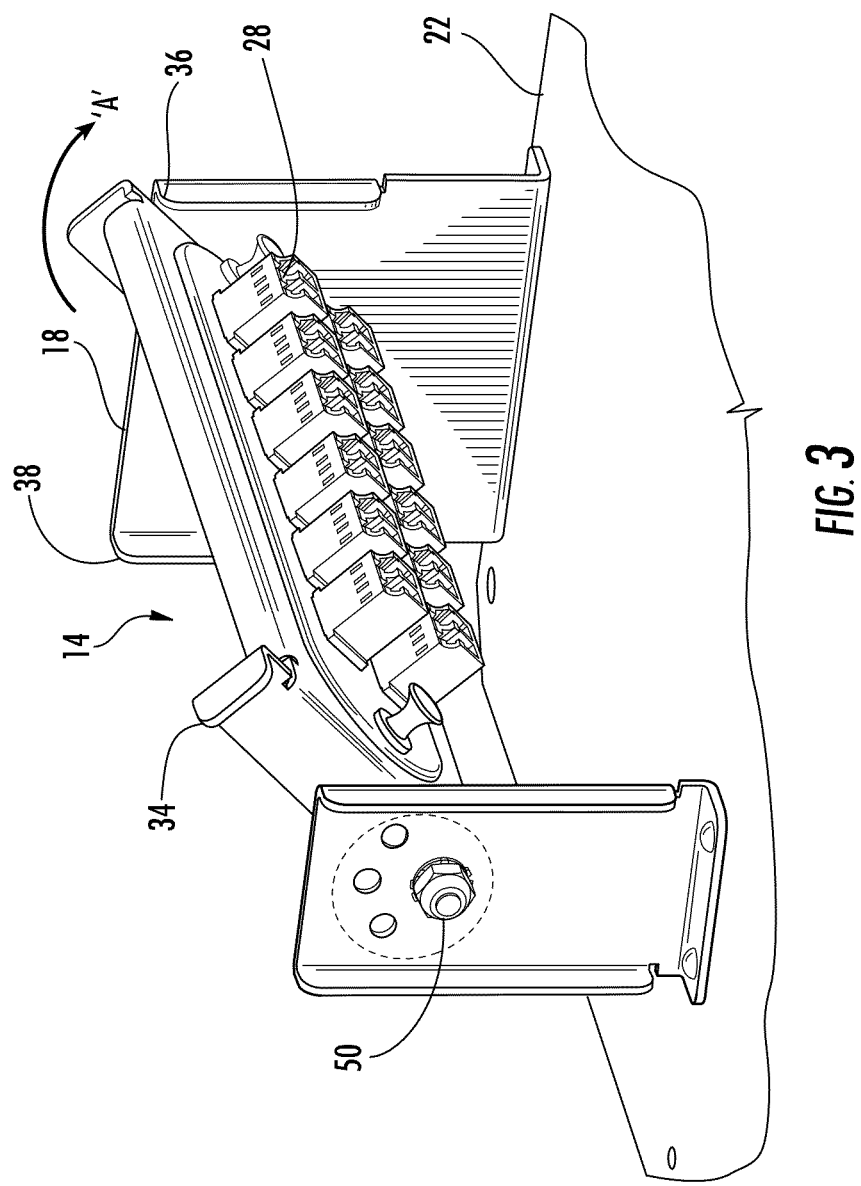
FIG. 3 is a schematic diagram of a front perspective view of the adapter panel support assembly of FIG. 1 rotated to a forward position and FIG. 4 is a schematic diagram of a front perspective view of the adapter panel support assembly of FIG. 1 rotated to a rearward position.
Figure 4:
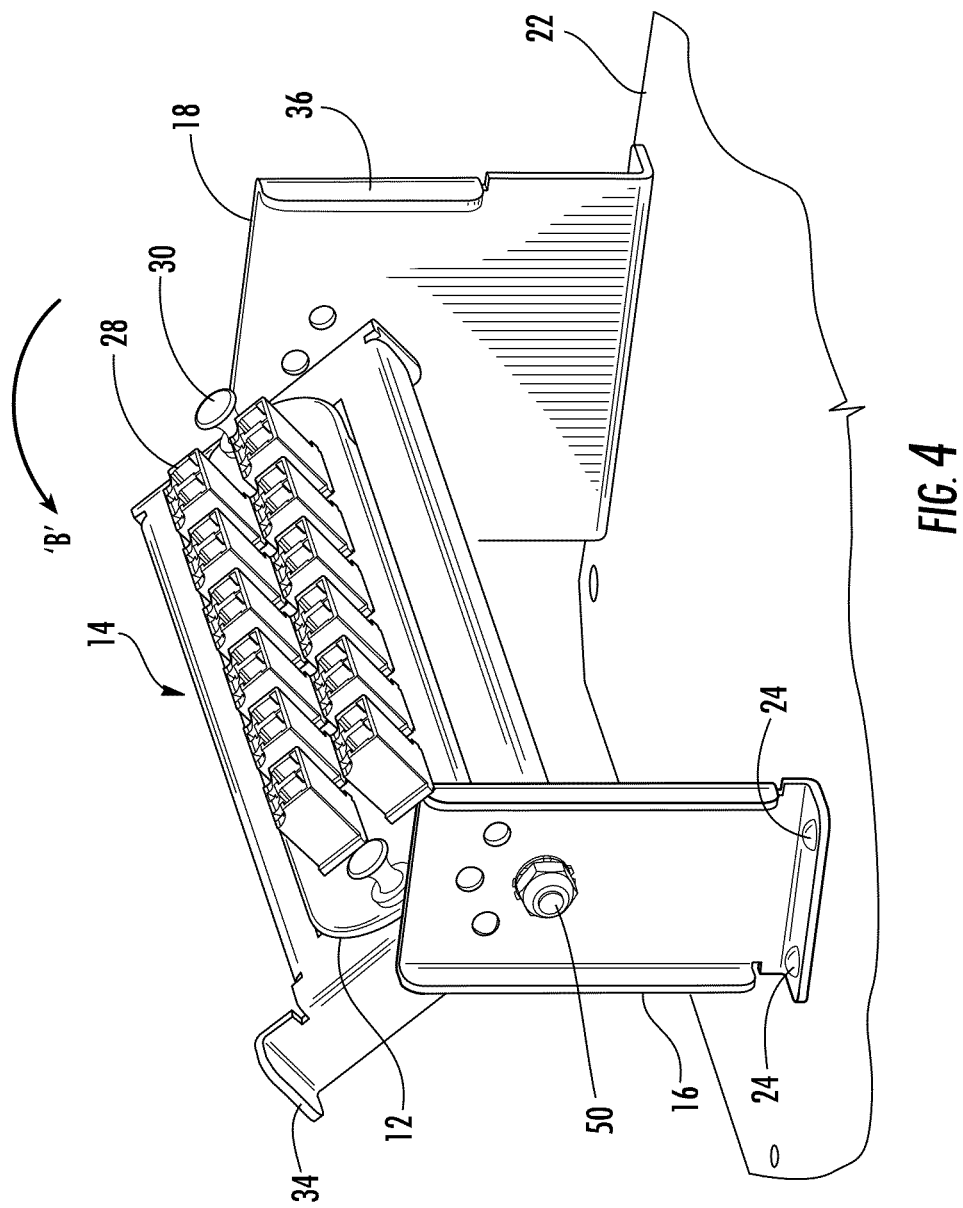

In this regard, FIG. 3 illustrates the frame assembly 14 rotated in the forward rotational direction 'A' and contacting forward stop 36. In this position, access may be faciliated to the back end of the adapters 28 to inspect and/or manipulate the fiber optic cables and/or connectors connected to the back end of the adapters 28. FIG. 4 illustrates the frame assembly 14 rotated in the rearward rotational direction 'B' and contacting rearward stop 38 (not visible in FIG. 4). In this position, access may be faciliated to the front end of the adapters 28 to inspect and/or manipulate the fiber optic cables and/or connectors connected to the front end of the adapters 28.

Figure 5:
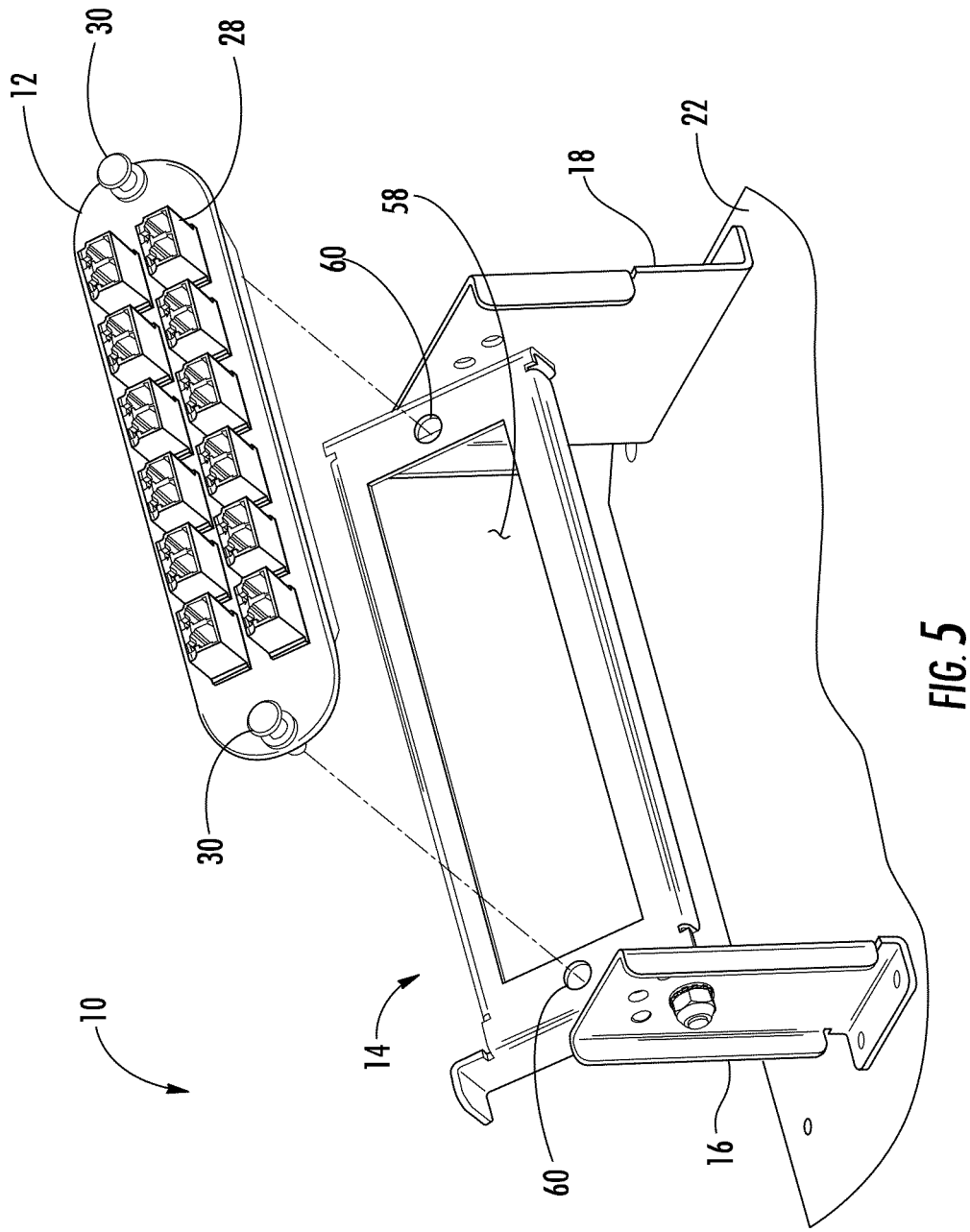
FIG. 5 is a schematic diagram of a perspective, exploded detail view of a frame assembly of the adapter panel support assembly of FIG. 1.

Referring now to FIG. 5, the adapter panel support assembly 10 is illustrated with the adapter panel 12 shown unattached from the frame assembly 14 in an exploded view. The frame assembly 14 has an adapter access area 58 extending through the frame assembly 14. The adapter panel 14 is removably mounted to the frame assembly 14 by inserting the push-pins 30 through the attachment holes 60. The attachment holes 60 are located on the frame assembly 14 in a manner such that when the push-pins 30 insert into the attachment holes 60, the adapters 28 on the adapter panel 12 align with the adapter access area 58. In this way, access may be provided to the front and back of the adapters 28, particularly as the frame assembly 14 is rotated in the forward and rearward rotational directions. Additionally, the frame assembly may be adjustable to accommodate different types and/or sizes of adapter panels.

Many modifications and other embodiments set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

What is claimed is:

1. An adapter panel support assembly, comprising:
   a frame assembly adapted to receive and support an adapter panel;
   a mounting bracket for mounting the frame assembly to a surface; and
   a connection assembly connecting the frame assembly to the mounting bracket, the connection assembly comprising:
   a plurality of detents positioned at the mounting bracket at predetermined locations and wherein the frame assembly releasably locks at positions of the detents; and
   a ball bearing plunger mounted in the frame assembly, wherein the ball bearing plunger retracts when a force is applied to the frame assembly to rotate the frame assembly between the detents,
   wherein the connection assembly allows the frame assembly to rotate and releasably lock at more than two positions when the force is applied to the frame assembly.

2. The adapter panel support assembly of claim 1, wherein the ball bearing plunger extends into each of the detents at the position of each of the detents to releasably lock the frame assembly at the position of the respective detent.

3. The adapter panel support assembly of claim 1, wherein the frame assembly has a flange adapted to allow force to be applied to the frame assembly to rotate the frame assembly.

4. The adapter panel support assembly of claim 1, wherein the frame assembly rotates about a generally horizontal axis.

5. The adapter panel support assembly of claim 1, further comprising a stop, wherein the stop limits the amount of rotation of the frame assembly.

6. The adapter panel support assembly of claim 5, wherein the stop comprises a forward stop to limit the amount of rotation of the frame assembly in a forward direction.

7. The adapter panel support assembly of claim 5, wherein the stop comprises a rearward stop to limit the amount of rotation of the frame assembly in a rearward direction.

8. The adapter panel support assembly of claim 1, wherein the mounting bracket comprises a first mounting bracket and a second mounting bracket.

9. The adapter panel support assembly of claim 8, wherein the first mounting bracket is attached to the frame assembly at a first location.

10. The adapter panel support assembly of claim 8, wherein the second mounting bracket is attached to the frame assembly at a second location.

11. The adapter panel support assembly of claim 8, wherein at least one of the first mounting bracket and the second mounting bracket comprises a stop for limiting the rotation of the frame assembly in one or both of a forward or rearward direction.

12. The adapter panel support assembly of claim 1, wherein the frame assembly is configured to allow the adapter panel to be releasably attached to the frame assembly.

13. The adapter panel support assembly of claim 1, wherein the frame assembly allows for access to front and back of adapters mounted on the adapter panel.

14. The adapter panel support assembly of claim 1, wherein the connection assembly comprises a stud extending from the frame assembly and through the bracket.

15. The adapter panel support assembly of claim 1, further comprising an adapter panel received and supported by the frame assembly.

16. The adapter panel support assembly of claim 1, wherein the connection assembly allows the frame assembly to rotate about a rotational axis and releasably lock at more than two rotational postions about the rotational axis when force is applied to the frame assembly.

* * * * *